(12) United States Patent
Hwang et al.

(10) Patent No.: US 12,369,248 B2
(45) Date of Patent: Jul. 22, 2025

(54) CIRCUIT BOARD

(71) Applicant: LG INNOTEK CO., LTD., Seoul (KR)

(72) Inventors: Min Young Hwang, Seoul (KR); Hyun Gu Im, Seoul (KR); Byeong Kyun Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 226 days.

(21) Appl. No.: 17/792,768

(22) PCT Filed: Jan. 13, 2021

(86) PCT No.: PCT/KR2021/000453
§ 371 (c)(1),
(2) Date: Jul. 14, 2022

(87) PCT Pub. No.: WO2021/145662
PCT Pub. Date: Jul. 22, 2021

(65) Prior Publication Data
US 2023/0066269 A1 Mar. 2, 2023

(30) Foreign Application Priority Data

Jan. 14, 2020 (KR) .................. 10-2020-0004717
Jan. 14, 2020 (KR) .................. 10-2020-0004718

(51) Int. Cl.
*H05K 1/02* (2006.01)
(52) U.S. Cl.
CPC ... *H05K 1/0298* (2013.01); *H05K 2201/0275* (2013.01); *H05K 2201/09281* (2013.01);
(Continued)

(58) Field of Classification Search
CPC ........ H05K 1/0298; H05K 1/116; H05K 1/02; H05K 2201/0275; H05K 2201/0338;
(Continued)

(56) References Cited

U.S. PATENT DOCUMENTS 4,547,443 A * 10/1985 Rowlette ................. H01M 4/14
429/228
6,306,935 B1 * 10/2001 Hayashi .................. C08L 81/06
523/466

(Continued)

FOREIGN PATENT DOCUMENTS

| | | |
|---|---|---|
| CN | 102349359 | 2/2012 |
| JP | 2014-053604 | 3/2014 |

(Continued)

OTHER PUBLICATIONS

International Search Report dated May 4, 2021 issued in Application No. PCT/KR2021/000453.

(Continued)

*Primary Examiner* — Timothy J Thompson
*Assistant Examiner* — Guillermo J Egoavil
(74) *Attorney, Agent, or Firm* — KED & ASSOCIATES, LLP

(57) ABSTRACT

A circuit board according to an embodiment includes an insulating layer; and a via portion disposed in a via hole formed in the insulating layer; wherein the via portion includes: a first pad disposed on a lower surface of the insulating layer; a second pad disposed on an upper surface of the insulating layer; a third pad disposed in the via hole and disposed on the first pad; and a connection portion disposed in the via hole and disposed between the second pad and the third pad.

18 Claims, 11 Drawing Sheets

(52) U.S. Cl.
CPC ............... *H05K 2201/09481* (2013.01); *H05K 2201/096* (2013.01)

(58) Field of Classification Search
CPC .......... H05K 2201/09281; H05K 2201/09481; H05K 2201/096; H05K 3/4644
USPC ......................................................... 174/250
See application file for complete search history.

(56) References Cited

U.S. PATENT DOCUMENTS

| | | |
|---|---|---|
| 8,389,866 B2 | 3/2013 | Chisaka |
| 9,214,411 B2 | 12/2015 | Park et al. |
| 2005/0247968 A1 | 11/2005 | Oh et al. |
| 2006/0121255 A1 | 6/2006 | Nam et al. |
| 2012/0000695 A1 | 1/2012 | Chisaka |
| 2014/0060896 A1 | 3/2014 | Shin et al. |
| 2016/0021736 A1 | 1/2016 | Han et al. |
| 2020/0170102 A1* | 5/2020 | Lee .......................... H05K 3/06 |

FOREIGN PATENT DOCUMENTS

| | | |
|---|---|---|
| KR | 10-2006-0062896 | 6/2006 |
| KR | 10-0598264 | 7/2006 |
| KR | 10-2012-0072636 | 7/2012 |
| KR | 10-2014-0132229 | 11/2014 |
| KR | 10-2015-0043933 | 4/2015 |
| KR | 10-2015-0082934 | 7/2015 |
| KR | 10-2016-0097799 | 8/2016 |

OTHER PUBLICATIONS

Chinese Office Action dated May 30, 2025 issued in Application No. 202180014139.X.

* cited by examiner

[FIG. 1]
Prior Art
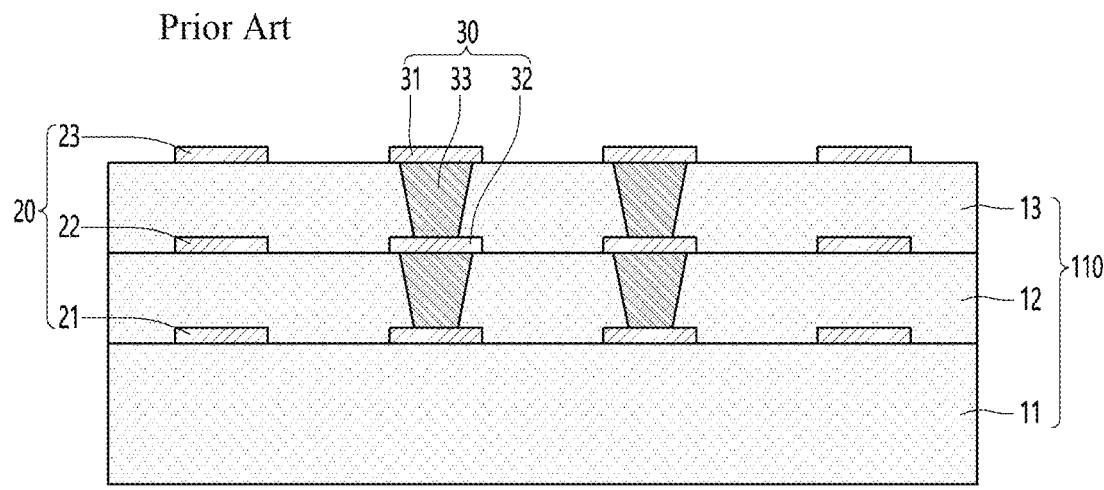
[FIG. 2a]
Prior Art
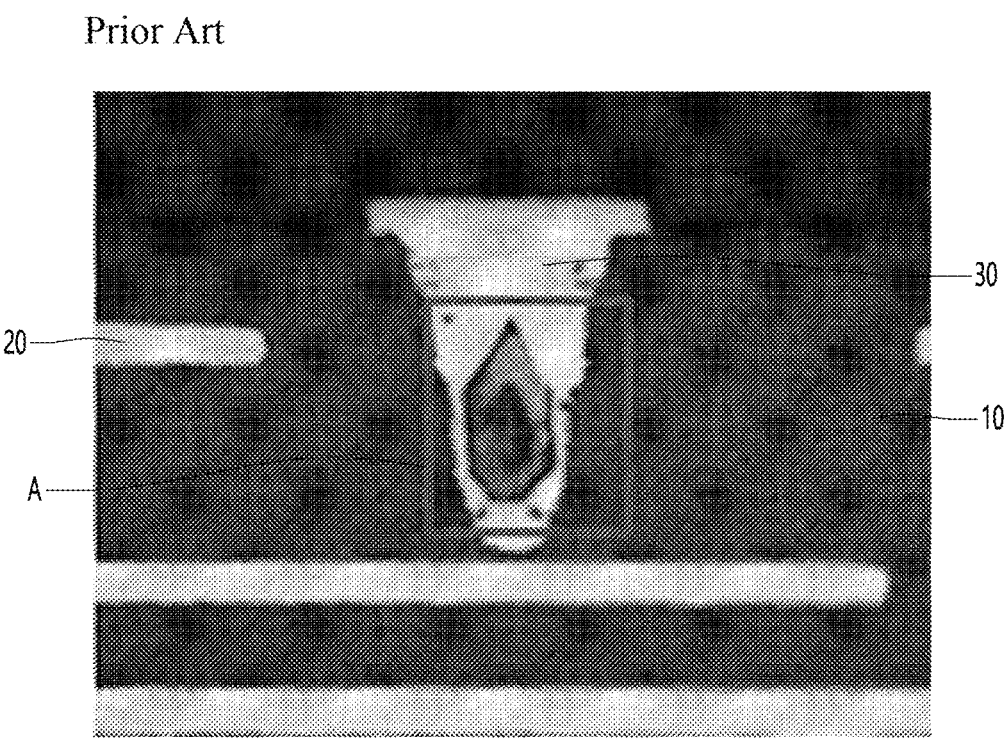

[FIG. 2b]
Prior Art
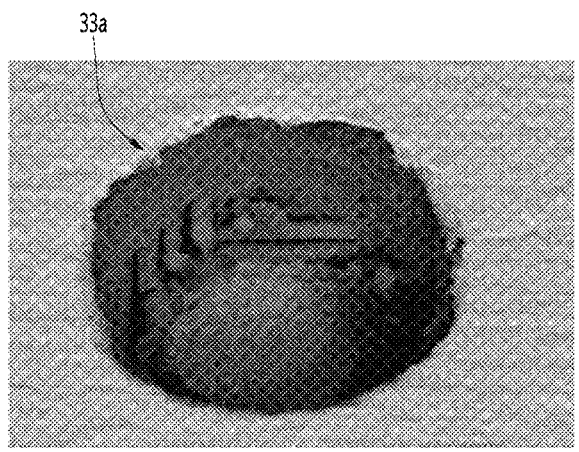
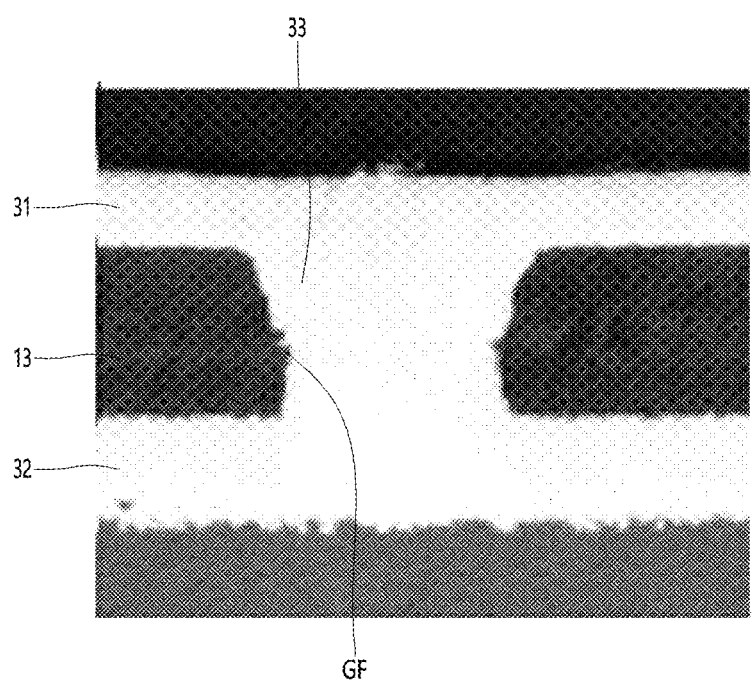

[FIG. 3]
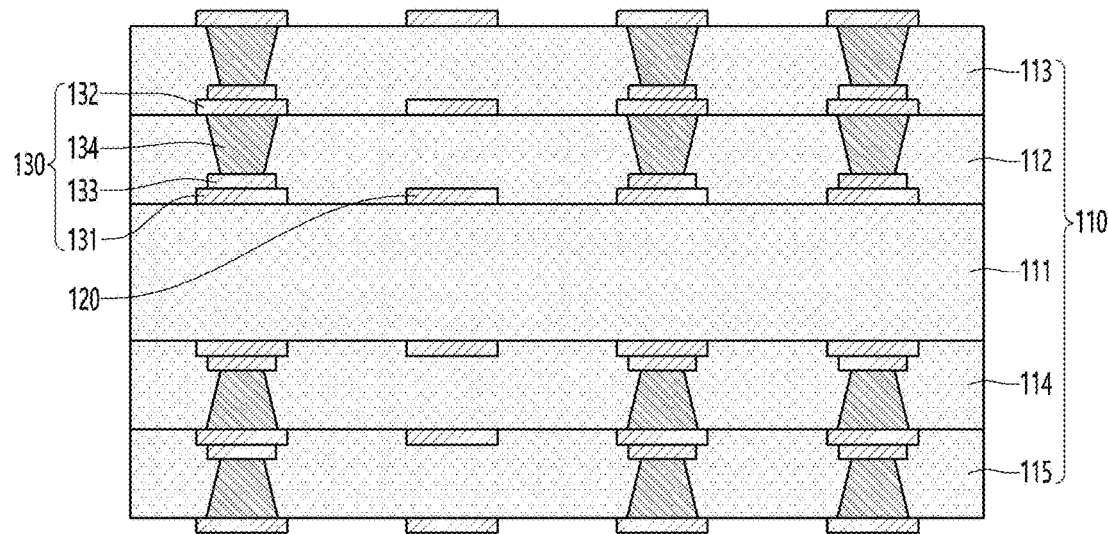
[FIG. 4]
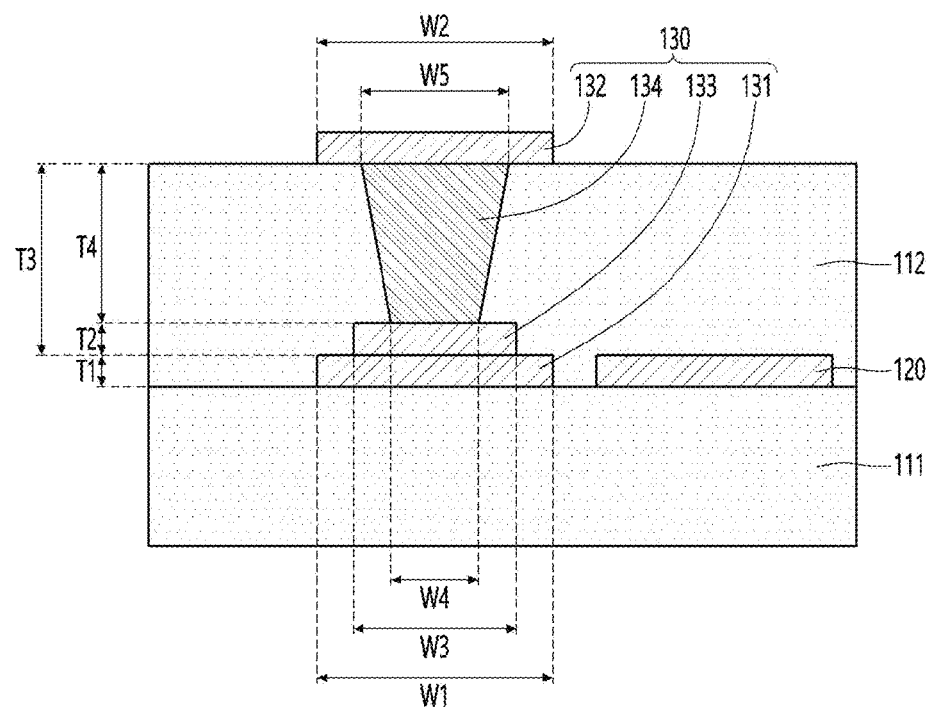

[FIG. 5]
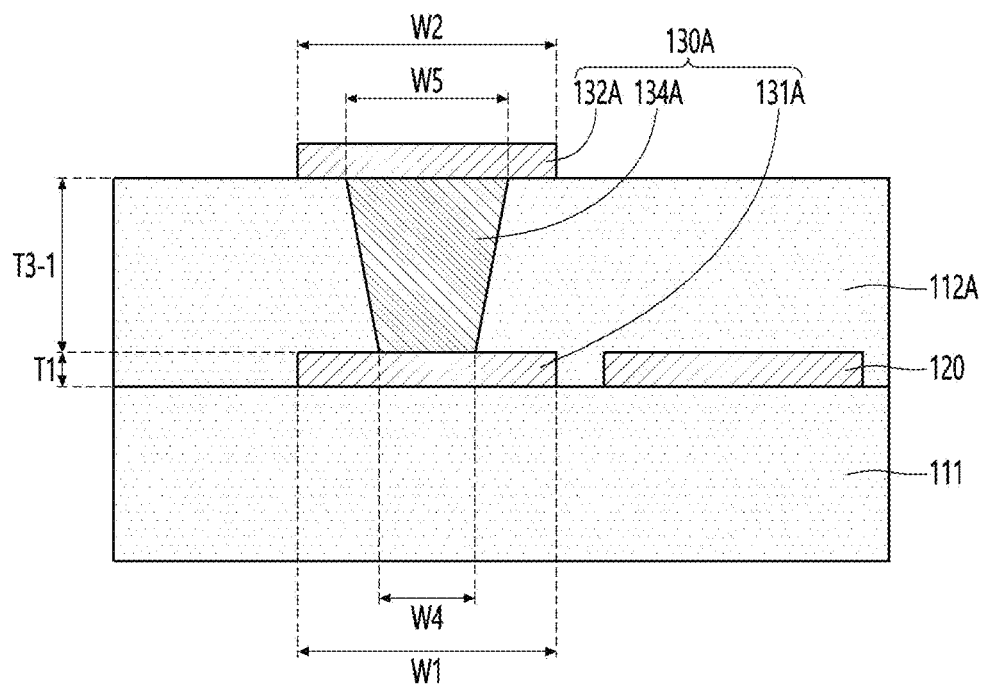

[FIG. 6]
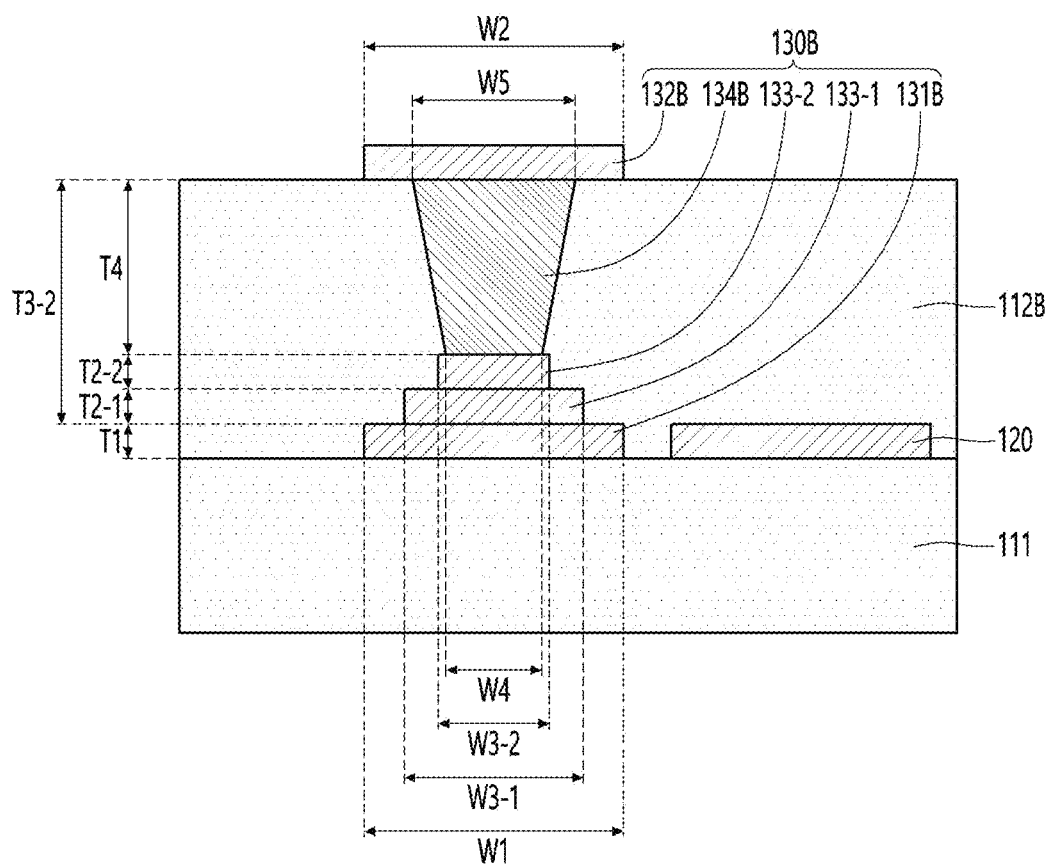

[FIG. 7]
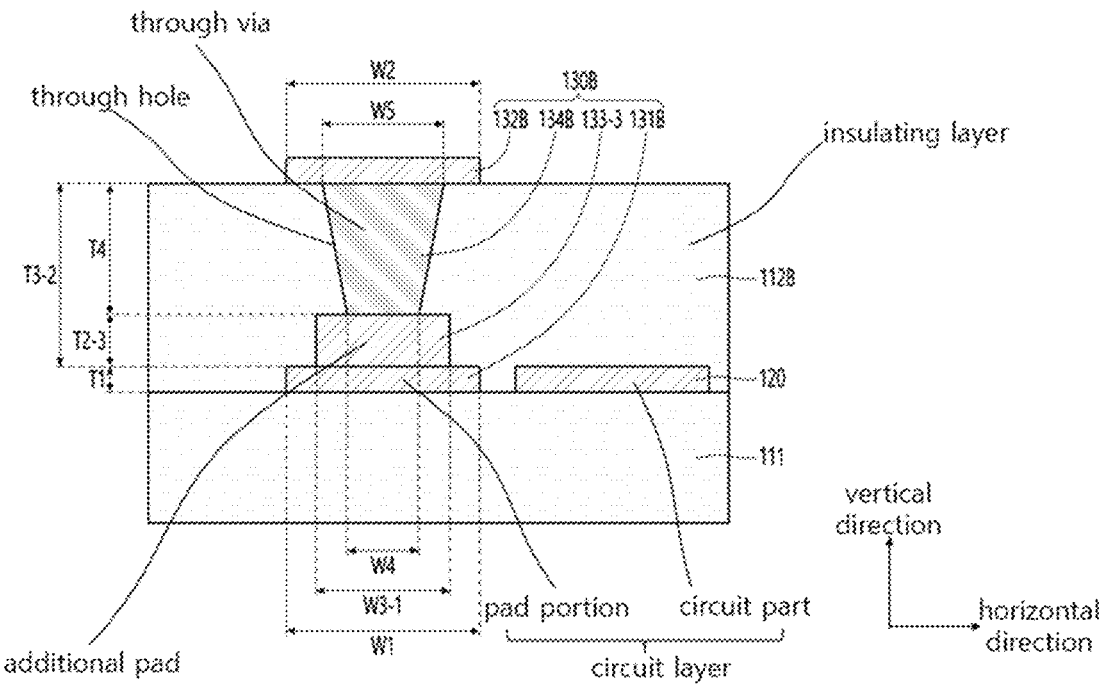
[FIG. 8]
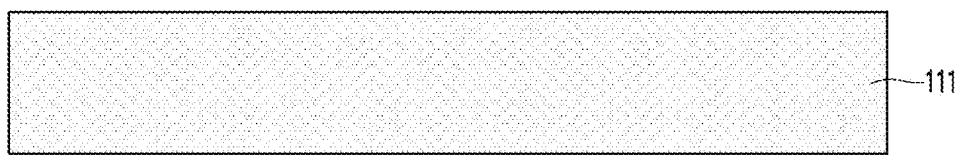
[FIG. 9]
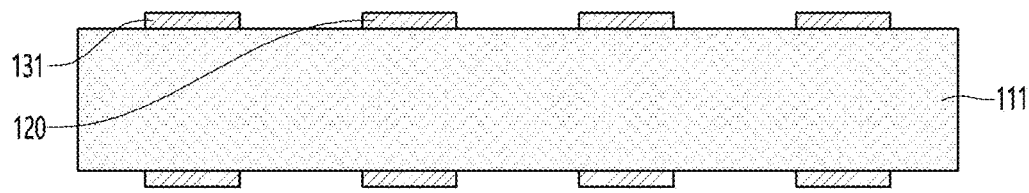

[FIG. 10]
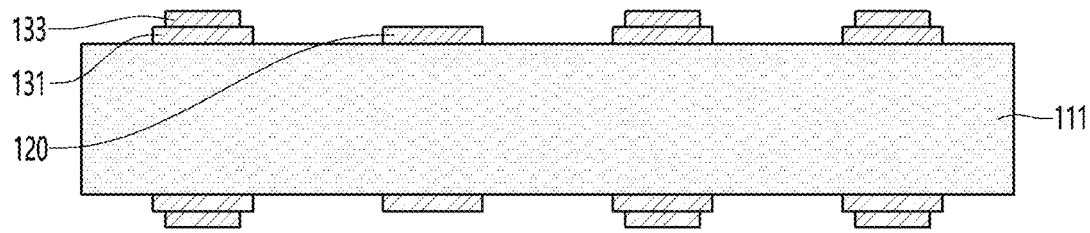
[FIG. 11]
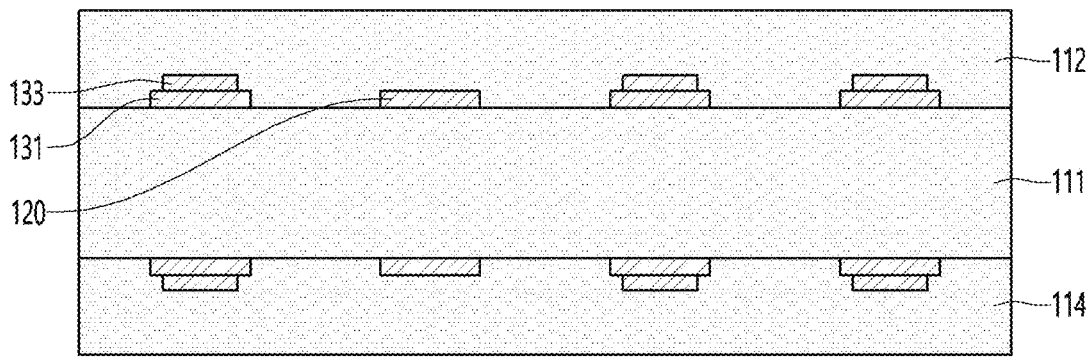
[FIG. 12]
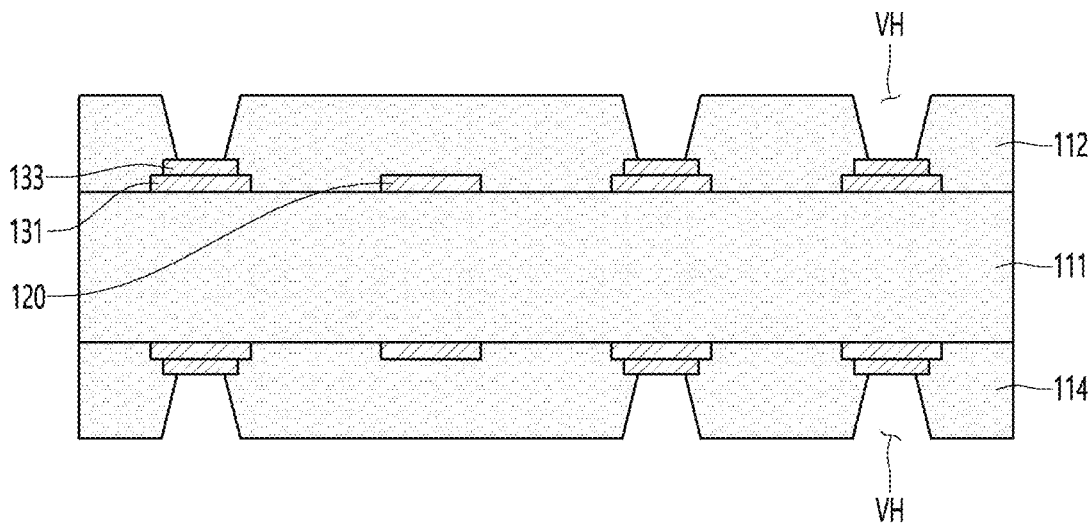

[FIG. 13]
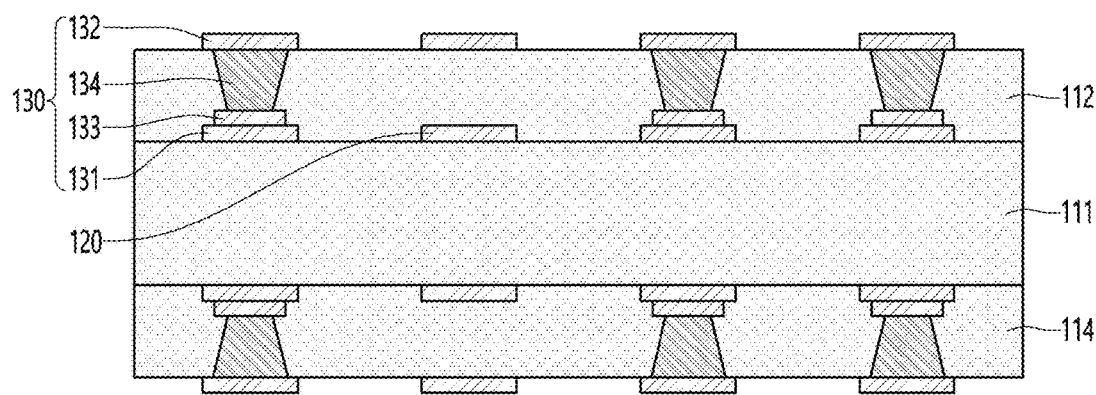
[FIG. 14]
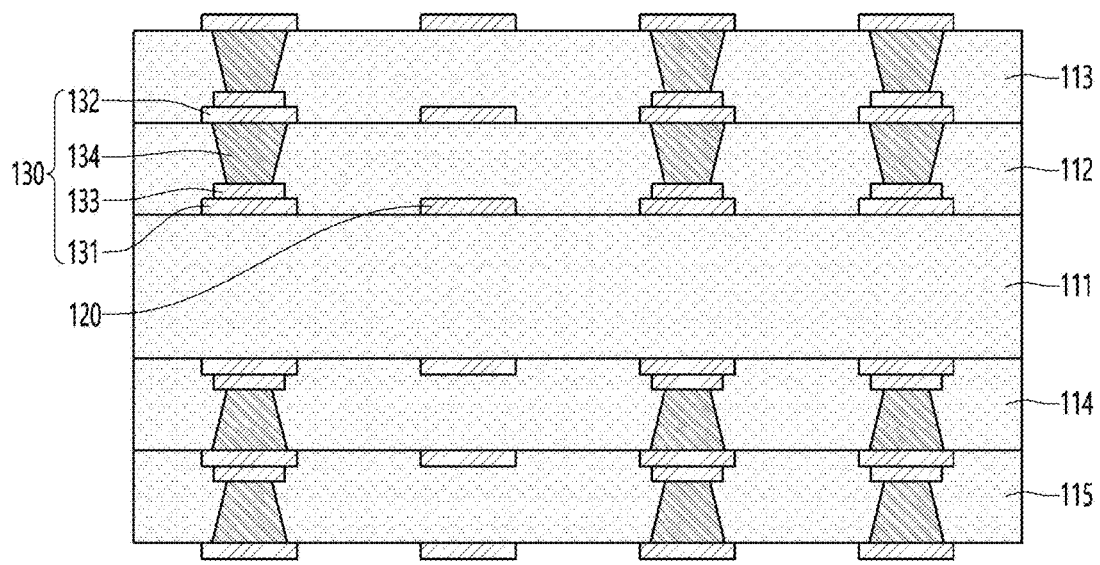

[FIG. 15]
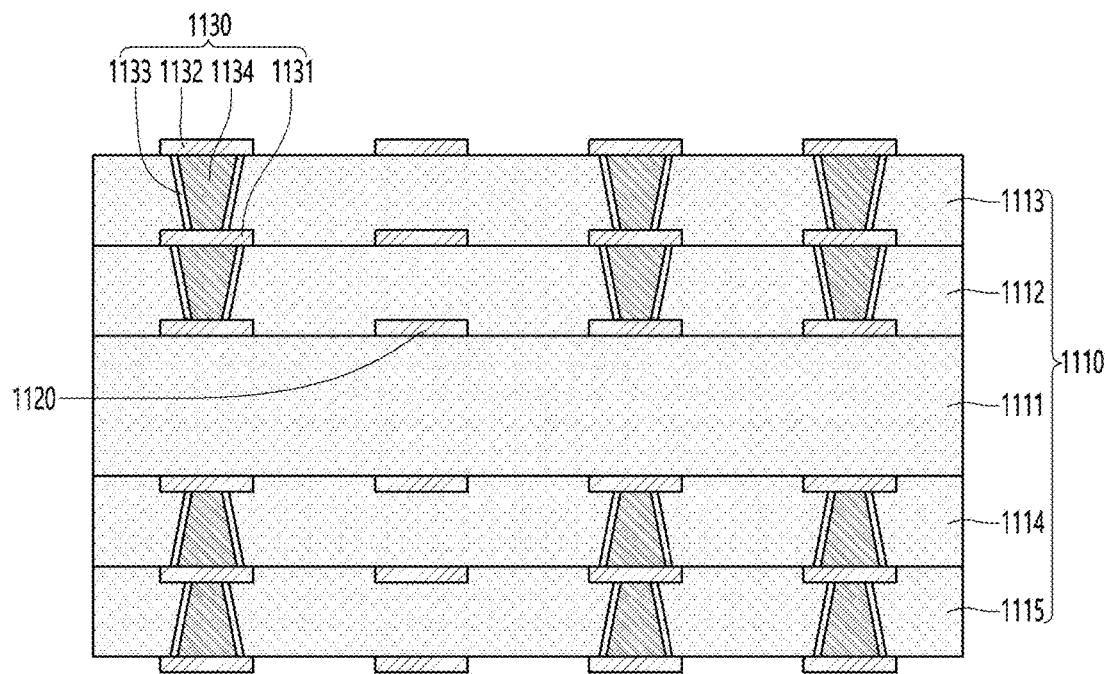
[FIG. 16]
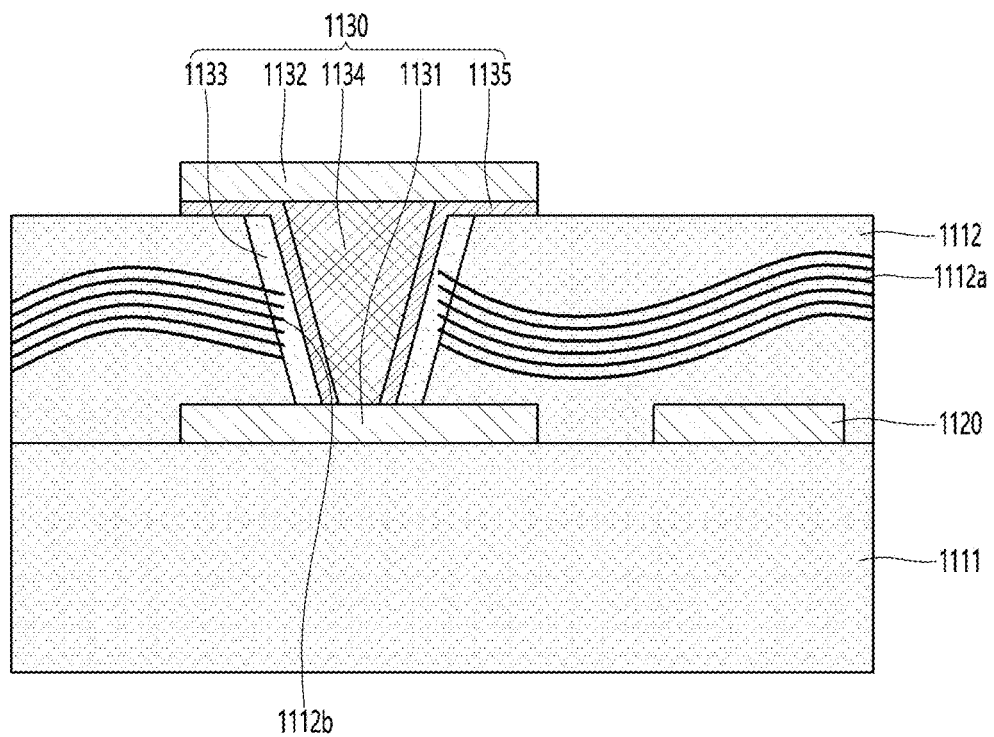

[FIG. 17]
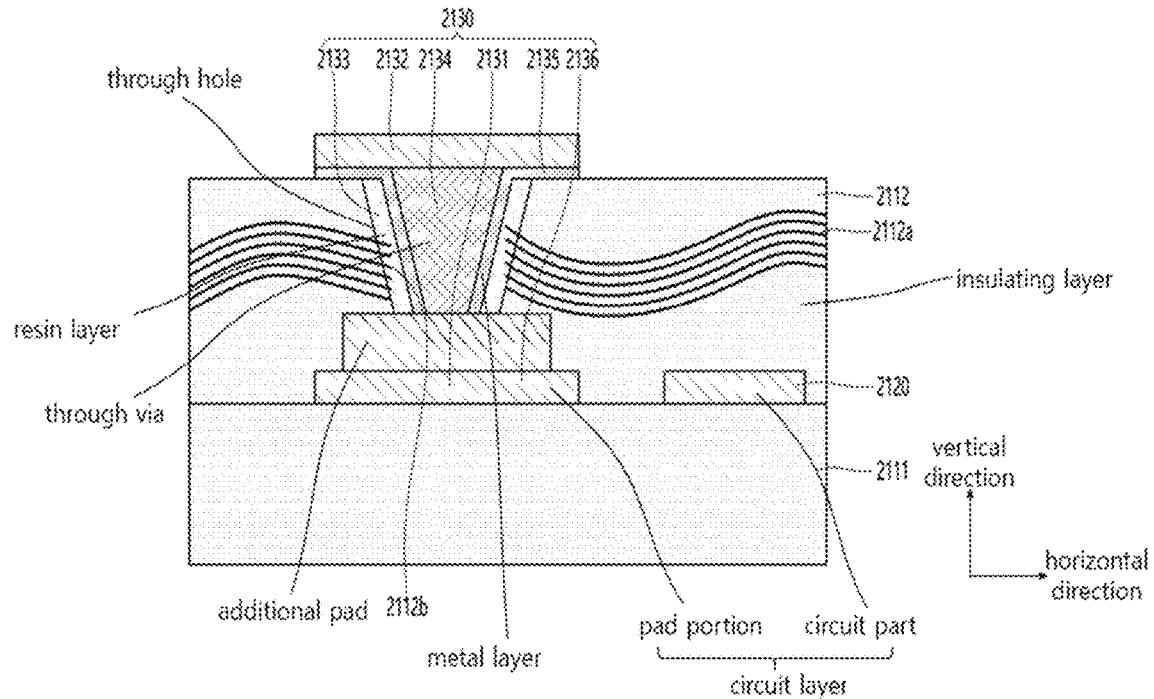
[FIG. 18]
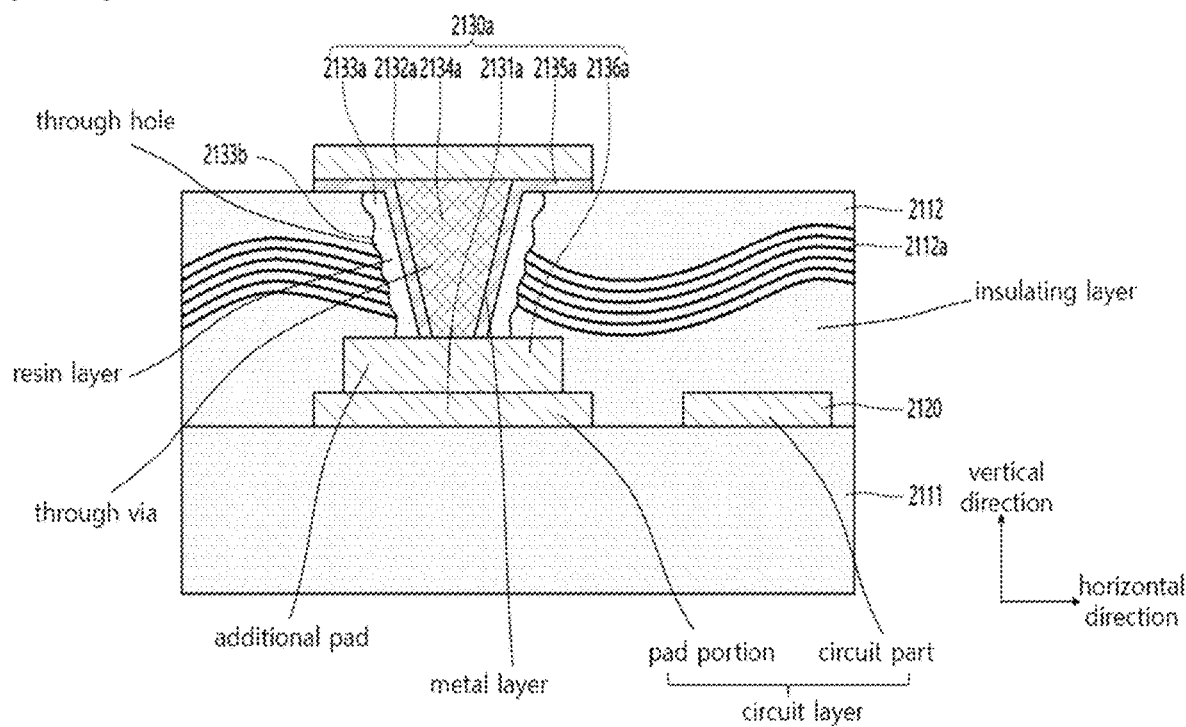

[FIG. 19]
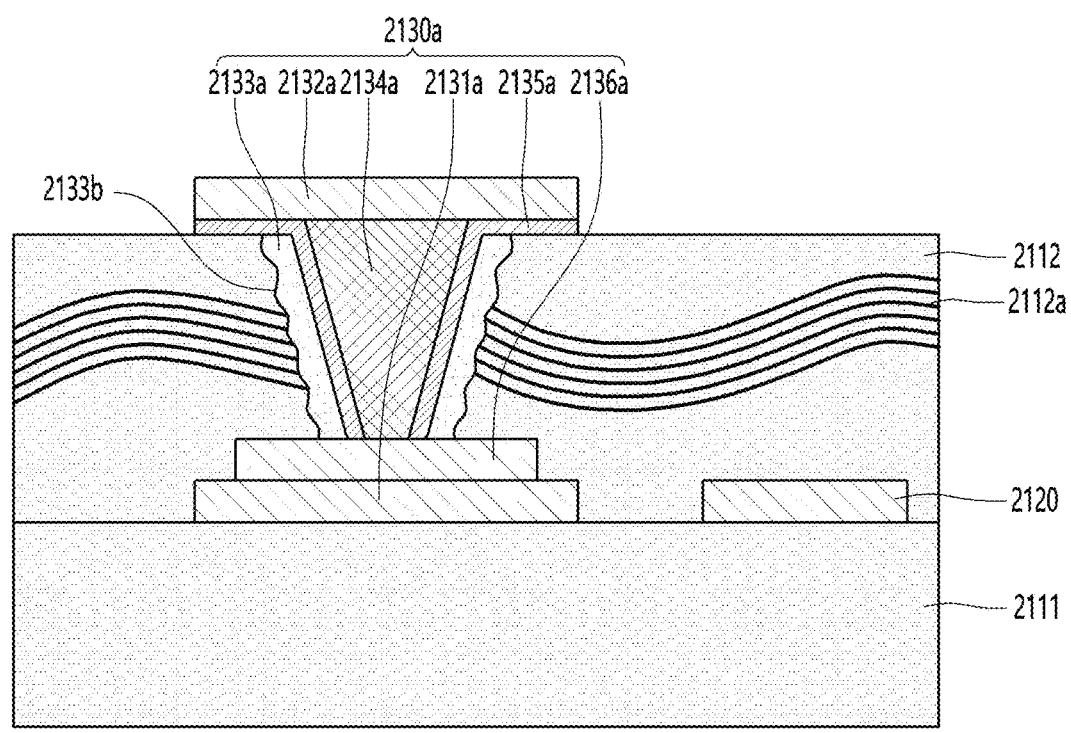

CIRCUIT BOARD

CROSS-REFERENCE TO RELATED PATENT APPLICATIONS

This application is a U.S. National Stage Application under 35 U.S.C. § 371 of PCT Application No. PCT/KR2021/000453, filed Jan. 13, 2021, which claims priority to Korean Patent Application Nos. 10-2020-0004717 and 10-2020-0004718, both filed Jan. 14, 2020, whose entire disclosures are hereby incorporated by reference.

TECHNICAL FIELD

The present invention relates to a circuit board.

BACKGROUND ART

Recently, in order to meet a demand for wireless data traffic, efforts have been made to develop an improved 5G (5th generation) communication system or a pre-5G communication system. Here, the 5G communication system uses ultra-high frequency (mm-Wave) band (sub 6 GHz, 28 GHz, 38 GHz, or higher frequencies) to achieve high data transfer rates.

In addition, in order to reduce a path loss of radio waves and increase a transmission distance of radio waves in the ultra-high frequency band, in the 5G communication system, integration technologies such as beamforming, massive multi-input multi-output (massive MIMO), and array antennas have been developed. Considering that it may be composed of hundreds of active antennas of wavelengths in the frequency bands, an antenna system becomes large relatively.

Since such an antenna and AP module are patterned or mounted on the printed circuit board, low loss on the printed circuit board is very important. This means that several substrates constituting the active antenna system, that is, an antenna substrate, an antenna power feeding substrate, a transceiver substrate, and a baseband substrate, should be integrated into one compact unit.

In addition, package technology to adapt to the 5G communication environment is developing, and for this reason, the development of a material for a circuit board or a material having excellent physical properties in a manufacturing process thereof is in progress.

At this time, a package field targeting a thin thickness is overcoming the limitations of the dielectric layer and circuit pattern layer process, and an antenna field that require a thick dielectric layer are being approached through process optimization.

However, a circuit board requiring a thick dielectric layer, such as an antenna, has a problem in reliability of vias formed in the dielectric layer due to an increase in the thickness of the dielectric layer.

In addition, the via is formed by plating after forming a through hole in one side surface of the substrate including the circuit pattern.

At this time, the through hole is formed using a physical method or a chemical method, and the roughness of the inner wall of the through hole has a high value, and accordingly, there is a problem in that a signal loss occurs due to an increase in the roughness of a via formed in the through hole.

DISCLOSURE

Technical Problem

The embodiment provides a circuit board capable of solving a reliability problem caused by a plating defect of a connection portion by using an additional pad having a predetermined height formed at one end of a connection portion constituting the via portion.

In addition, the embodiment provides a circuit board in which the roughness of the outer surface of the connection portion constituting the via portion has a value close to zero.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment includes an insulating layer; a first circuit pattern disposed under a lower surface of the insulating layer; a second circuit pattern disposed on an upper surface of the insulating layer; and a via portion disposed in the insulating layer and including a connection portion connecting the first circuit pattern and the second circuit pattern, wherein the first circuit pattern includes a first trace and a first pad constituting the via portion and connected to the connection portion, wherein the second circuit pattern includes a second trace and a second pad constituting the via portion and connected to the connection portion, and wherein the via portion includes a third pad disposed between the first pad and the connection portion.

In addition, a thickness of the insulating layer corresponding to a distance from an upper surface of the first pad to a lower surface of the second pad exceeds 20 μm.

In addition, a lower surface of the connection portion is in direct contact with an upper surface of the third pad, and an upper surface of the connection portion is in direct contact with a lower surface of the second pad.

In addition, a thickness of the connection portion is smaller than the thickness of the insulating layer.

In addition, the third pad has the same thickness as that of the first pad.

In addition, the third pad has a width smaller than a width of the first pad.

In addition, the connection portion includes an upper surface and a lower surface having a width smaller than a width of the upper surface, and a width of the lower surface of the connection portion is smaller than a width of the third pad.

In addition, a number or thickness of the third pad is determined by the thickness of the insulating layer.

In addition, the thickness of the insulating layer corresponding to a distance from the upper surface of the first pad to the lower surface of the second pad exceeds 40 μm, and the third pad includes at least two layers.

In addition, the thickness of the insulating layer corresponding to the distance from the upper surface of the first pad to the lower surface of the second pad exceeds 40 μm, and the thickness of the third pad is greater than the thickness of the first pad.

On the other hand, the manufacturing method of the circuit board includes preparing a first insulating layer; forming a first circuit pattern including a first pad and a first trace on an upper surface of the first insulating layer; forming a third pad on the first pad of the first circuit pattern; forming a second insulating layer on the first insulating layer; forming a through hole exposing the third pad in the second insulating layer; forming a second circuit pattern including a connection portion connected to the third pad in the through hole and a second pad connected to the connection portion on the second insulating layer; wherein a lower surface of the connection portion is positioned higher than an upper surface of the first trace.

In addition, a thickness of the insulating layer corresponding to a distance from an upper surface of the first pad to a lower surface of the second pad exceeds 20 μm.

In addition, a thickness of the connection portion is smaller than the thickness of the insulating layer.

In addition, the third pad has the same thickness as that of the first pad.

In addition, the third pad has a width smaller than a width of the first pad.

In addition, the connection portion includes an upper surface and a lower surface having a width smaller than a width of the upper surface, and a width of the lower surface of the connection portion is smaller than a width of the third pad.

In addition, the thickness of the insulating layer corresponding to a distance from the upper surface of the first pad to the lower surface of the second pad exceeds 40 μm, and the third pad includes at least two layers.

In addition, the thickness of the insulating layer corresponding to the distance from the upper surface of the first pad to the lower surface of the second pad exceeds 40 μm, and the thickness of the third pad is greater than the thickness of the first pad.

A circuit board according to an embodiment includes an insulating layer; and a via portion disposed in a via hole formed in the insulating layer, wherein the via portion includes: a first pad disposed on a lower surface of the insulating layer; a second pad disposed on an upper surface of the insulating layer; a resin layer disposed on an inner wall of the via hole of the insulating layer; and a connection portion disposed in the via hole and connected to the first pad and the pad, wherein a side surface of the connection portion directly contacts a first side surface of the resin layer.

In addition, the insulating layer includes glass fibers therein, and wherein at least a portion of the glass fibers exposed through the via hole is disposed in the resin layer.

In addition, a second side surface of the resin layer in contact with the inner wall of the via hole includes a curved surface.

In addition, the via portion includes a metal layer disposed between the resin layer and the connection portion.

In addition, an upper surface of the first pad includes a first portion in contact with the insulating layer, a second portion in contact with the resin layer, a third portion in contact with the metal layer, and a fourth portion in contact with the connection portion.

In addition, the first side surface of the resin layer in contact with the side surface of the connection portion includes a plane having a predetermined inclination angle.

In addition, a surface roughness of the side surface of the connection portion corresponds to a surface roughness of the first side surface of the resin layer.

On the other hand, the manufacturing method of the circuit board according to the embodiment includes preparing an insulating layer, forming a via hole in the insulating layer; forming a resin layer filling a portion of the via hole on an inner wall of the formed via hole; and forming a via portion including a connection portion filling the remaining portion of the via hole on the resin layer, and wherein a side surface of the connection portion is in direct contact with the first side surface of the resin layer.

In addition, the insulating layer includes glass fibers therein, and wherein the Forming of the resin layer includes forming the resin layer filling the glass fiber exposed through the via hole.

In addition, the insulating layer includes glass fibers therein, wherein the method further includes removing the glass fiber exposed through the via hole before forming the resin layer.

In addition, a second side surface of the resin layer in contact with the inner wall of the via hole includes a curved surface.

In addition, the method includes forming a metal layer that is a seed layer of the connection portion when the resin layer is formed In addition, a first side surface of the resin layer in contact with the side surface of the connection portion includes a plane having a predetermined inclination angle.

Advantageous Effects

The circuit board of the embodiment includes a via portion disposed in the insulating layer. In this case, the via portion is a first pad disposed on one surface of the insulating layer, a second pad disposed on the other surface of the insulating layer, and a connection portion disposed in the insulating layer and connecting the first pad and the second pad. In this case, in the embodiment, an additional third pad is disposed between the connection portion and the first pad in order to solve a plating defect problem occurring in the connection portion depending on the thickness of the insulating layer. In this case, the thickness of the third pad may be determined by the thickness of the insulating layer. In addition, the third pad may have the same thickness as the first pad and may have a plurality of layers according to the thickness of the insulating layer. Accordingly, the embodiment can solve plating defects such as voids occurring in the plating process of the via hole formed in the insulating layer, and accordingly, the reliability of the circuit board can be improved. In addition, the embodiment may secure the design freedom of the circuit board according to the design change of the via portion.

In addition, in the circuit board of the embodiment, a surface roughness value of the via portion may have a value substantially close to zero. Specifically, the insulating layer of the circuit board contains glass fibers, and accordingly, the glass fiber may be exposed through the via hole in the process of forming the via hole. And, when the connection portion of the via portion is formed in a state in which the glass fiber is exposed, the surface roughness of the connection portion is increased by the glass fiber, and thus a signal loss occurs. Accordingly, in the embodiment, a resin layer is formed on the inner wall of the via hole after the via hole is formed. In this case, the resin layer may cover the glass fiber exposed through the via hole. In addition, the connection portion of the via portion is formed on the resin layer formed on the inner wall of the via hole. Accordingly, an outer surface of the connection portion of the via portion of the embodiment has a value corresponding to the surface roughness of the resin layer, and this may be a value substantially close to zero. Accordingly, in the embodiment, the surface roughness of the connection portion can be maintained at a value close to zero by removing the exposure of the glass fiber through the inner wall of the via hole of the insulating layer, and accordingly, it is possible to minimize the signal loss generated through the connection portion.

In addition, the embodiment can minimize the surface roughness of the via portion to minimize the transmission loss in the high-frequency region, and accordingly, it is possible to provide a circuit board applicable to an application product using a high frequency band.

DESCRIPTION OF DRAWINGS

FIG. 1 is a view showing a circuit board according to a comparative example.

FIG. 2a is a view showing a plating defect occurring in the via portion of FIG. 1.

FIG. 2b is a view showing an inner wall of the via hole of FIG. 1.

FIG. 3 is a view showing a circuit board according to a first embodiment.

FIG. 4 is a view showing a structure of a via portion according to a first-first embodiment.

FIG. 5 is a view showing the structure of the via portion according to a first-second embodiment.

FIG. 6 is a view showing the structure of a via portion according to a first-third embodiment.

FIG. 7 is a view showing the structure of a via portion according to a first-fourth embodiment.

FIGS. 8 to 14 are views showing a manufacturing method of the circuit board shown in FIG. 3 in order of process.

FIG. 15 is a view showing a circuit board according to a second embodiment.

FIG. 16 is a view showing the structure of a via portion according to a second-first embodiment.

FIG. 17 is a view showing the structure of a via portion according to a second-second embodiment.

FIG. 18 is a view showing a circuit board according to a third embodiment.

FIG. 19 is a view showing a circuit board according to a fourth embodiment.

BEST MODE

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

As used herein, the singular forms "a," "an" and "the" are intended to include the plural forms as well, unless the context clearly indicates otherwise.

It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

FIG. 1 is a view showing a circuit board according to a comparative example, FIG. 2a is a view showing a plating defect occurring in the via portion of FIG. 1, and FIG. 2b is a view showing an inner wall of the via hole of FIG. 1.

Referring to FIGS. 1, 2a and 2b, the circuit board according to the comparative example includes an insulating layer 10, a circuit pattern 20 disposed on the surface of the insulating layer 10, and a via portion 30 disposed to pass through the insulating layer 10.

The insulating layer 10 has a plurality of layer structures. For example, the insulating layer 10 may include a first insulating layer 11, a second insulating layer 12 disposed on the first insulating layer 11, and a third insulating layer 13 disposed on the second insulating layer 12.

The circuit pattern 20 is disposed on the surface of the insulating layer 10. For example, the circuit pattern 20 includes a first circuit pattern 21 disposed on an upper surface of the first insulating layer 11, and a second circuit pattern 22 disposed on an upper surface of the first insulating layer 12, and a third circuit pattern 23 disposed on an upper surface of the third insulating layer 13.

The via portion 30 is disposed in the insulating layer 10.

The via portion 30 includes a first pad 31 disposed on one surface of the insulating layer 10, a second pad 32 disposed on the other surface of the insulating layer 10, and a connection portion 33 disposed in the insulating layer 10 and connecting the first pad 31 and the second pad 32.

The via portion 30 as described above is implemented by forming a via hole in the insulating layer 10 through processing such as laser and filling the via hole with a metal material by an electrolytic plating method to form the connection portion 33.

In this case, a plating quality of the via portion 30 is affected by a thickness of the insulating layer 10. That is, the plating quality of the via portion disposed in the second insulating layer 12 is affected by the thickness of the second insulating layer 12, and as the thickness of the second insulating layer 12 increases, the reliability decreases.

That is, the thickness of the insulating layer constituting the circuit board is increasing in order to adapt to the recent 5G communication environment.

At this time, as shown in FIG. 2a, when the thickness of the insulating layer exceeds 30 μm, a void region (A) in which a part of the via hole is not filled may occur in the plating process of the via hole formed inside the insulating layer, and accordingly, a defect occurs in that a part of the internal space of the connection portion is empty.

And, when the void region (A) exists in the connection portion 33 of the via portion 30 as described above, delamination may occur in the void region (A), and there is a risk of fire due to concentration of an electric field in the void region (A).

Meanwhile, the surface roughness of the via portion 30 should have a value close to zero in order to minimize signal transmission loss in the high frequency band. That is, the signal transmission loss is representative of a conductor loss and a dielectric loss of a wiring such as the circuit pattern 20 or the via portion 30.

At this time, the conductor loss of the wiring has a characteristic that the electric signal flows to the surface of the conductor as the high-frequency signal becomes, and accordingly, a technique for controlling the surface state of the conductor is very important. However, as shown in (a) of FIG. 2b, the glass fiber (GF) disposed inside the insulating layer is exposed on the surface of the via hole 33a in the comparative example. Accordingly, as shown in (b) of FIG. 2b, the surface roughness of the via portion 30 of the comparative example has a very large value due to the exposed glass fibers.

Here, when the surface roughness of the connection portion 33 is large, since the signal is transmitted to the surface of the conductor, the resistance to movement or transmission of the signal increases, thereby increasing the signal transmission loss.

FIG. 3 is a view showing a circuit board according to a first embodiment.

Referring to FIG. 3, the circuit board includes an insulating layer 110, a circuit pattern 120, and a via portion 130.

The insulating layer 110 may be a support substrate of a circuit board on which a single circuit pattern is formed, but may mean an insulating region on which any one circuit pattern is formed among circuit boards having a plurality of stacked structures.

The insulating layer 110 may have a plurality of stacked structures.

For example, the insulating layer 110 may include the first insulating layer 111. In addition, the insulating layer 110 may include a second insulating layer 112 disposed on the first insulating layer 111. In addition, the insulating layer 110 may include a third insulating layer 113 disposed on the second insulating layer 112. In addition, the insulating layer 110 may include a fourth insulating layer 114 disposed under the first insulating layer 111. In addition, the insulating layer 110 may include a fifth insulating layer 115 disposed under the fourth insulating layer 114.

For example, at least one of the first insulating layer 111, the second insulating layer 112, the third insulating layer 113, the fourth insulating layer 114, and the fifth insulating layer 115 may be rigid or may be flexible. For example, at least one of the first insulating layer 111, the second insulating layer 112 and the third insulating layer 113, the fourth insulating layer 114 and the fifth insulating layer 115 may include glass or plastic. In detail, at least one of the first insulating layer 111, the second insulating layer 112 and the third insulating layer 113, the fourth insulating layer 114 and the fifth insulating layer 115 may include chemically strengthened/semi-tempered glass such as soda lime glass or aluminosilicate glass, or strengthened or flexible plastic such as polyimide (PI), polyethylene terephthalate (PET), propylene glycol (PPG) and polycarbonate (PC), or sapphire.

In addition, at least one of the first insulating layer 111, the second insulating layer 112, the third insulating layer 113, the fourth insulating layer 114, and the fifth insulating layer 115 may include an optical isotropic film. For example, at least one of the first insulating layer 111, the second insulating layer 112, the third insulating layer 113, the fourth insulating layer 114, and the fifth insulating layer 115 may be includes COC (cyclic Olefin Copolymer), COP (Cyclic Olefin Polymer), photo isotropic polycarbonate (polycarbonate, PC), or photo isotropic polymethyl methacrylate (PMMA).

In addition, at least one of the first insulating layer 111, the second insulating layer 112, the third insulating layer 113, the fourth insulating layer 114, and the fifth insulating layer 115 may be bent while having a partially curved surface. That is, at least one of the first insulating layer 111, the second insulating layer 112, the third insulating layer 113, the fourth insulating layer 114, and the fifth insulating layer 115 may be bent while having a partially flat surface and a partially curved surface. In detail, at least one of the first insulating layer 111, the second insulating layer 112, the third insulating layer 113, the fourth insulating layer 114, and the fifth insulating layer 115 may have a curved end while having a curved surface, or may have a surface including a random curvature and may be bent or curved.

In addition, at least one of the first insulating layer 111, the second insulating layer 112, the third insulating layer 113, the fourth insulating layer 114, and the fifth insulating layer 115 may be a flexible substrate having a flexible characteristic. Also, at least one of the first insulating layer 111, the second insulating layer 112, the third insulating layer 113, the fourth insulating layer 114, and the fifth insulating layer 115 may be a curved or bent substrate.

A circuit pattern 120 may be disposed on a surface of each of the first insulating layer 111, the second insulating layer 112, the third insulating layer 113, the fourth insulating layer 114, and the fifth insulating layer 115. For example, the circuit pattern 120 may be disposed on an upper surface and a lower surface of the first insulating layer 111. For example, the circuit pattern 120 may be disposed on the upper surface of the second insulating layer 112. For example, the circuit pattern 120 may be disposed on the upper surface of the third insulating layer 113. For example, the circuit pattern 120 may be disposed on the lower surface of the fourth insulating layer 114. For example, the circuit pattern 120 may be disposed on the lower surface of the fifth insulating layer 115.

Meanwhile, the circuit pattern 120 as described above is a wire that transmits an electrical signal, and may be formed of a metal material having high electrical conductivity. To this end, the circuit pattern 120 may be formed of at least one metal material selected from gold (Au), silver (Ag), platinum (Pt), titanium (Ti), tin (Sn), copper (Cu), and zinc (Zn). In addition, the circuit pattern 120 may be formed of a paste or solder paste including at least one metal material selected from gold (Au), silver (Ag), platinum (Pt), titanium (Ti), tin (Sn), copper (Cu), and zinc (Zn) having excellent bonding power. Preferably, the circuit pattern 120 may be formed of copper (Cu) having high electrical conductivity and a relatively inexpensive price.

The circuit pattern 120 may be formed by an additive process, a subtractive process, a modified semi additive process (MSAP), and a semi additive process (SAP) process, which are typical circuit board manufacturing processes. and a detailed description thereof will be omitted here.

Meanwhile, the via portion 130 is disposed in the first insulating layer 111, the second insulating layer 112, the third insulating layer 113, the fourth insulating layer 114, and the fifth insulating layer 115. The via portion 130 may electrically connect the circuit patterns 120 disposed on different layers to each other.

Accordingly, a part of the configuration of the via portion 130 may include the circuit pattern 120. This will be described in more detail below.

The via portion 130 may be formed by filling an inside of a through hole (not shown) penetrating at least one insulating layer among the plurality of insulating layers with a conductive material.

The through hole may be formed by any one of mechanical, laser, and chemical processing. When the through hole is formed by machining, methods such as milling, drilling, and routing may be used, and when formed by laser processing, a UV or CO2 laser method may be used. In addition, when formed by chemical processing, at least one of plurality of insulating layers may be opened by using a chemical containing aminosilane, ketones, or the like.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has a wide range of possible thicknesses.

As the laser processing drill, it is preferable to use a YAG (Yttrium Aluminum Garnet) laser, a CO2 laser, or an ultraviolet (UV) laser. YAG laser is a laser that can process both copper foil layers and insulating layers, and CO2 laser is a laser that can process only insulating layers.

When the through hole is formed, the via portion 130 may be formed by filling the inside of the through hole with a conductive material. The metal material forming the via portion 130 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, inkjetting and dispensing.

The via portion 130 may include a first pad 131, a second pad 132, a third pad 133, and a connection portion 134.

Hereinafter, for convenience of description, a via portion disposed in the second insulating layer 112 among the plurality of insulating layers will be described.

The first pad 131 and the second pad 132 may be a part of the circuit pattern 120. For example, the first pad 131 may be any one of the circuit patterns disposed on different layers, and the second pad 132 may be a circuit pattern other than the first pad 131 among circuit patterns disposed on different layers. In other words, the circuit pattern 120 may include a trace, which is a wiring line that is disposed on the insulating layer and transmits a signal, and a via pad directly connected to the via portion.

For example, the via portion 130 may be formed to pass through the second insulating layer 112.

In this case, the first pad 131 may be a circuit pattern disposed under the second insulating layer 112, preferably a circuit pattern disposed on the upper surface of the first insulating layer 111. In addition, the second pad 132 may be a circuit pattern disposed on the second insulating layer 112, preferably a circuit pattern disposed on the upper surface of the second insulating layer 112.

Here, although it is illustrated that the first pad 131 and the second pad 132 are configured as a single layer, this may vary depending on a manufacturing method of the first pad 131 and the second pad 132. For example, when the first pad 131 and the second pad 132 are manufactured by an electroplating method, the first pad 131 and the second pad 132 may have a two-layer structure. Preferably, the first pad 131 and the second pad 132 may have a two-layer structure including a seed layer.

The connection portion 134 may electrically connect the circuit patterns 120 disposed on different layers. Preferably, the connection portion 134 may connect the first pad 131 and the second pad 132 disposed on different layers.

In this case, in the embodiment, an additional third pad 133 may be disposed between the connection portion 134 and the first pad 131 according to the thickness of the insulating layer on which the connection portion 134 is disposed.

The second insulating layer 112 may have a range of 5 μm to 300 μm. In addition, when the thickness of the second insulating layer 112 exceeds 20 μm, the third pad 133 may be additionally disposed between the connection portion 134 and the first pad 131. Here, the thickness of the second insulating layer 112 may mean a linear distance from the upper surface of the first pad 131 to the upper surface of the second insulating layer 112.

That is, when the thickness of the second insulating layer 112 exceeds 20 μm, the connection portion 134 should be formed to correspond to the thickness of the second insulating layer 112. In this case, as described in the comparative example, when the thickness of the second insulating layer 112 exceeds 20 μm, a void region may occur in the process of forming the connection portion 134.

Accordingly, in the embodiment, when the thickness of the second insulating layer 112 exceeds 20 μm, the additional third pad 133 is disposed between the connection portion 134 and the first pad 131. In addition, the thickness of the connection portion 134 may be reduced by the thickness of the third pad 133 from the thickness of the second insulating layer 112. In addition, as the thickness of the connection portion 134 is reduced, a void region formed in the process of plating the connection portion 134 may be removed. And, as the void region is removed, the reliability of the circuit board may be improved.

In this case, the thickness of the third pad 133 may be determined by the thickness of the second insulating layer 112. For example, the thickness of the third pad 133 may be 50% to 80% of the thickness of the second insulating layer 112. When the thickness of the third pad 133 is formed to be less than 50% of the thickness of the second insulating layer 112, a void region may be included in the connection portion 134, which may cause a reliability problem. In addition, when the thickness of the third pad 133 exceeds 80% of the thickness of the second insulating layer 112, as the thickness of the connection portion 134 decreases, the function of the via portion may not be normally performed.

The third pad 133 may have the same thickness as the first pad 131. Also, according to an embodiment, the third pad 133 may have a different thickness from the thickness of the first pad 131. This may be determined according to the processing capability of the equipment for forming the third pad 133.

In addition, when the third pad 133 has the same thickness as the first pad 131, the third pad 133 may be formed as a single layer according to the thickness of the second insulating layer 112, alternatively may be composed of a plurality of layers.

Also, when the third pad 133 can be formed to have a thickness greater than that of the first pad 131, the thickness of the third pad 133 may be determined according to the thickness of the second insulating layer 112. This will be described in more detail below.

Meanwhile, at least one of the insulating layers 101, 102, 103, 104, and 105 in the embodiment may have a low dielectric constant.

In addition, at least one of the insulating layers 101, 102, 103, 104, and 105 may have a coefficient of thermal expansion of 50 ppm/° C. or less. In detail, the insulating layers 101, 102, 103, 104, and 105 may have a coefficient of thermal expansion of 15 ppm/° C. to 50 ppm/° C.

Accordingly, at least one of the insulating layers 101, 102, 103, 104, and 105 may have a low coefficient of thermal expansion, thereby minimizing cracks in the insulating layer due to temperature change.

To this end, at least one of the insulating layers 101, 102, 103, 104, and 105 may be formed of two materials. In detail, at least one of the insulating layers 101, 102, 103, 104, and 105 may include a material in which two compounds are mixed. In detail, at least one of the insulating layers 101, 102, 103, 104, and 105 may include a first compound and a second compound.

The first material and the second material may be included in a certain ratio range. In detail, the first material and the second material may be included in a ratio of 4:6 to 6:4.

In addition, at least one of the insulating layers 101, 102, 103, 104, and 105 may further include inorganic particles. In detail, at least one of the insulating layers 101, 102, 103, 104, and 105 may further include inorganic particles such as silicon dioxide ($SiO_2$). The inorganic particles may be included in an amount of about 55 wt % to about 70 wt % based on the entirety of at least one of the insulating layers 101, 102, 103, 104, and 105.

When the ratio of the inorganic particles is out of the above range, the size of the coefficient of thermal expansion or the dielectric constant may be increased by the inorganic particles, and thus properties of the insulating layer may be deteriorated.

Also, the first material and the second material may be chemically non-bonded with each other in at least one of the insulating layers 101, 102, 103, 104 and 105. However, embodiments are not limited thereto, and the first material including the first compound and the second material including the second compound may be chemically bonded directly or through a separate linking group.

The first material may include a material having an insulating property. In addition, the first material may have improved mechanical properties due to high impact strength. In detail, the first material may include a resin material. For example, the first material may include a first compound such as polyphenyl ether (PPE).

The first material may include a plurality of the first compounds, and the first compounds may be formed by chemically bonding with each other. For example, the first compound may be linearly connected to each other by a covalent bond (or a pi-pi (π-π) bond).

That is, the first compounds may be formed by chemically bonding with each other so that the first material has a molecular weight of about 300 to 500.

In addition, the second material may include the second compound. In detail, the second material may be formed by chemically bonding a plurality of second compounds to each other.

The second compound may include a material having a low dielectric constant and a coefficient of thermal expansion. In addition, the second compound may include a material having improved mechanical strength.

The second compound may include tricyclodecane and a terminal group connected to the tricyclodecane. The terminal group connected to the tricyclodecane may include various materials in which the second compounds may be connected to each other by a carbon double bond (C=C bonding). In detail, the terminal group connected to the tricyclodecane may include an acrylate group, an epoxide group, a carboxyl group, a hydroxyl group, and an isocyanate group.

The second compounds may be linked to each other between the terminal groups connected to the tricyclodecane. Specifically, the second compounds are cross-linked between the terminal groups by a carbon double bond (C=C bonding) to form a network structure.

Hereinafter, the structure of the via portion 130 according to the embodiment will be described in more detail.

FIG. 4 is a view showing a structure of a via portion according to a first-first embodiment, FIG. 5 is a view showing the structure of the via portion according to a first-second embodiment, FIG. 6 is a view showing the structure of a via portion according to a first-third embodiment, and FIG. 7 is a view showing the structure of a via portion according to a first-fourth embodiment.

In this case, each structure of the via portion 130 shown in FIGS. 4 to 7 may be divided according to the thickness of the insulating layer on which the via portion 130 is disposed.

With reference to FIGS. 4 to 7, the via portion 130 in the embodiment will be described in detail.

Referring to FIG. 4, the circuit board includes insulating layers 111 and 112.

In addition, the via portion 130 may be disposed on any one of the insulating layers 111 and 112. Hereinafter, the second insulating layer 112 on which the via portion 130 is disposed will be referred to as an insulating layer.

The via 130 is disposed to penetrate the insulating layer 112.

To this end, the via portion 130 includes a first pad 131 disposed on one surface of the insulating layer 112 and a second pad 132 disposed on the other surface of the insulating layer 112. At this time, although the drawing shows that the first pad 131 is buried in a lower region of the insulating layer 112, the embodiment is not limited thereto. For example, the first pad 131 may be disposed under the lower surface of the insulating layer 112 depending on the position of the insulating layer 112.

The second pad 132 may be disposed on the upper surface of the insulating layer 112. In addition, the connection portion 134 may be disposed in the insulating layer 112. In this case, the thickness of the insulating layer 112 in the embodiment may be greater than 20 μm. Accordingly, the via portion 130 may include a third pad 133 additionally disposed between the connection portion 134 and the first pad 131.

In other words, the thickness of the connection portion 134 is smaller than the thickness of the insulating layer 112.

Here, the thickness of the insulating layer 112 may mean a linear distance from the upper surface of the first pad 131 to the lower surface of the second pad 132.

That is, in the comparative example, the connection portion was disposed between the first pad and the second pad regardless of the thickness of the insulating layer. In other words, in the comparative example, the connection portion was formed to have the same thickness as the thickness of the insulating layer corresponding to the distance between the first pad and the second pad. And, in this case, a plating defect such as a void region occurs in the connection portion.

Accordingly, in the embodiment, the third pad 133 is additionally disposed between the first pad 131 and the connection portion 134 to reduce the thickness of the connection portion 134 by the thickness of the third pad 133. For example, even if the thickness of the insulating layer 112 is greater than 20 μm, the thickness of the connection portion 134 may be less than 20 μm. In other words, the thickness of the connection portion 134 may correspond to the thickness of the insulating layer 112 minus the thickness of the third pad 133.

The first pad 131 may be disposed on one surface of the insulating layer to have a first thickness T1. In addition, the third pad 133 may be disposed on the first pad 131 to have a second thickness T2 corresponding to the first thickness T1. Also, the connection portion 134 may be disposed on the third pad 133 to have a fourth thickness T4.

In this case, the thickness of the insulating layer 112 may have a third thickness T3 greater than 20 μm and smaller than 40 μm. Preferably, the thickness of the insulating layer 112 may correspond to a distance from the upper surface of the first pad 131 to the lower surface of the second pad 132.

That is, in the comparative example, the connection portion was formed to have the same thickness as the thickness T3 of the insulating layer. On the other hand, in the embodiment, the connection portion 134 is formed with a fourth thickness T4 smaller than the third thickness T3 of the insulating layer 112, and thus the void region may be removed to improve reliability.

Meanwhile, the upper and lower surfaces of the first pad 131 may have the same width. For example, upper and lower surfaces of the first pad 131 may have a first width W1.

In addition, the upper and lower surfaces of the second pad 132 may have the same width. For example, upper and lower surfaces of the second pad 132 may have a second width W2.

Meanwhile, the third pad 133 may have a third width W3 smaller than the first width W1 of the first pad 131 and may be disposed on the first pad 131. In this case, the third width W3 of the third pad 133 may be the same as the first width W1. However, as the width of the third pad 133 increases, signal loss in the circuit pattern may occur. Accordingly, the width of the third pad 133 is made smaller than the width of the first pad 131.

In addition, the connection portion 134 may have different widths on the upper surface and the lower surface. For example, the width of the connection portion 134 may gradually decrease from the upper surface to the lower surface.

The width of the lower surface of the connection portion 134 may be formed to have a fourth width W4 smaller than the third width W3 of the third pad 133. That is, the third pad 133 may function as a stopper in the process of forming the via hole constituting the connection portion 134, and accordingly, the third pad 133 may be formed to have a third width W3 greater than the fourth width W4 of the lower surface of the connection portion 134.

In addition, an upper surface of the connection portion 134 may have a fifth width W5 greater than a fourth width W4 of a lower surface of the connection portion 134.

In this case, the circuit pattern 120 may be disposed on the lower surface of the insulating layer 112 to correspond to the first pad 131. Preferably, the first pad 131 may be one of a plurality of circuit patterns 120 disposed on the lower surface of the insulating layer 112.

Accordingly, a plurality of circuit patterns are disposed on the lower surface of the insulating layer 112. In this case, the circuit pattern constituting the via portion 130 may have a two-layer structure including the third pad 133, and the remaining circuit patterns except for may have a one-layer structure. In other words, the first pad 131 may be a circuit pattern disposed in a region vertically overlapping with the connection portion 134 among the circuit patterns 120 disposed on the lower surface of the insulating layer 112.

Referring to FIG. 5, the via portion 130A is disposed to pass through the insulating layer 112A.

To this end, the via portion 130A includes a first pad 131A disposed on one surface of the insulating layer 112A and a second pad 132A disposed on the other surface of the insulating layer 112A. In this case, although the drawing shows that the first pad 131A is buried in the lower region of the insulating layer 112A, the embodiment is not limited thereto. For example, the first pad 131A may be disposed under the lower surface of the insulating layer 112A according to a position where the insulating layer 112A is disposed among the plurality of insulating layers.

The second pad 132A may be disposed on the upper surface of the insulating layer 112A. In addition, the connection portion 134A may be disposed in the insulating layer 112A. In this case, the thickness of the insulating layer 112A in the embodiment may be less than 20 μm. Accordingly, a third pad the via portion 130A disposed between the connection portion 134A and the first pad 131A may be omitted.

That is, when the thickness of the insulating layer 112A is less than 20 μm, the void region in the connection portion 134A may be removed without the third pad, and thus the third pad may be omitted.

The first pad 131A may be disposed on one surface of the insulating layer to have a first thickness T1. Also, the connection portion 134A may be disposed on the first pad 131A to have a third-first thickness T3-1.

In this case, the insulating layer 112A may have a third-first thickness T3-1 that is less than 20 μm. That is, the thickness of the insulating layer 112A and the thickness of the connection portion 134A may have the same third-first thickness T3-1.

Referring to FIG. 6, the circuit board includes an insulating layer 112B and a via portion 130B. The via portion 130B is disposed to pass through the insulating layer 112B.

To this end, the via portion 130B includes a first pad 131B disposed on one surface of the insulating layer 112B and a second pad 132B disposed on the other surface of the insulating layer 112B. In this case, although the drawing shows that the first pad 131B is buried in the lower region of the insulating layer 112B, the embodiment is not limited thereto. For example, the first pad 131B may be disposed under the lower surface of the insulating layer 112B depending on the position of the insulating layer 112B.

The second pad 132B may be disposed on the upper surface of the insulating layer 112B. In addition, the connection portion 134B may be disposed in the insulating layer 112B. In this case, the thickness of the insulating layer 112 in the embodiment may be greater than 40 μm. Accordingly, the via portion 130B may include a plurality of third pads 133-1 and 133-2 additionally disposed between the connection portion 134B and the first pad 131.

In other words, the thickness of the connection portion 134B is smaller than the thickness of the insulating layer 112B.

Here, the thickness of the insulating layer 112B may mean a distance from the upper surface of the first pad 131B to the lower surface of the second pad 132B.

In the embodiment, third pads 133-1 and 133-2 are additionally disposed between the first pad 131B and the connection portion 134B, so that the thickness of the connection portion 134B is reduced by the thickness of the third pads 133-1 and 133-2. For example, even if the thickness of the insulating layer 112B is greater than 40 µm, the thickness of the connection portion 134B is less than 20 µm. In other words, the thickness of the connection portion 134B may correspond to the thickness of the insulating layer 112B minus the thickness of the third pads 133-1 and 133-2.

Here, it may be difficult for the third pads 133-1 and 133-2 to have a thickness of 20 µm or more depending on manufacturing process capabilities. In this case, the third pads 133-1 and 133-2 may have a plurality of layer structures. That is, when the third pads 133-1 and 133-2 are formed of only one layer, since the thickness of the insulating layer 112B exceeds 40 µm, the thickness of the connection portion 134B exceeds 20 µm, and accordingly, a void area may occur. Accordingly, in the embodiment, when the thickness of the insulating layer 112B is greater than 40 µm, the third pads 133-1 and 133-2 are formed with a plurality of layers as described above.

The first pad 131B may be disposed on one surface of the insulating layer to have a first thickness T1. In addition, the third pad 133B may be disposed on the first pad 131B to have a second thickness T2 corresponding to the first thickness T1. In addition, the connection portion 134B may be disposed on the third pads 133-1 and 133-2 to have a fourth thickness T4.

In this case, the insulating layer 112B may have a third-second thickness T3-2 greater than 40 µm. Preferably, the thickness of the insulating layer 112B may correspond to a distance from the upper surface of the first pad 131B to the lower surface of the second pad 132B.

Meanwhile, the third-first pad 133-1 may have a third-first width W3-1 smaller than the first width W1 of the first pad 131B, and may be disposed on the first pad 131B. In this case, a third-first width W3-1 of the third-first pad 133-1 may be the same as the first width W1. However, as the width of the third-first pad 133-1 increases, signal loss in the circuit pattern may occur. Accordingly, the width of the third-first pad 133-1 is made smaller than the width of the first pad 131B.

Also, the third-second pad 133-1 may have a third-second width W3-2 smaller than the third-first width W3-1 of the third-first pad 133-1, and may be disposed on the third-first pad 133-1. In this case, the third-second width W3-2 of the third-second pad 133-2 may be the same as the third-first width W3-1. However, as the width of the third-second pad 133-2 increases, signal loss in the circuit pattern may occur. Accordingly, the width of the third-second pad 133-2 is made smaller than the width of the third-first pad 133-1.

In addition, the connection portion 134B may have different widths on the upper surface and the lower surface. For example, the width of the connection portion 134B may gradually decrease from the upper surface to the lower surface.

The width of the lower surface of the connection portion 134B may be formed to have a fourth width W4 smaller than the third-second width W3-2 of the third-second pad 133-2. That is, the third-second pad 133-2 may function as a stopper in the process of forming the via hole constituting the connection portion 134B, and accordingly, the third-second pad 133-2 may be formed to have the third-second width W3-2 greater than the fourth width W4 of the lower surface of the connection portion 134B.

In addition, the upper surface of the connection portion 134B may have a fifth width W5 greater than the fourth width W4 of the lower surface of the connection portion 134B.

In this case, the circuit pattern 120 may be disposed on the lower surface of the insulating layer 112B to correspond to the first pad 131B. Preferably, the first pad 131B may be one of a plurality of circuit patterns 120 disposed on the lower surface of the insulating layer 112B.

Accordingly, a plurality of circuit patterns are disposed on the lower surface of the insulating layer 112B. In this case, the circuit pattern constituting the via portion 130B may have a three-layer structure including the third pad 133-1 and 133-2, and the remaining circuit patterns except for may have a one-layer structure. In other words, the first pad 131B may be a circuit pattern disposed in a region vertically overlapping with the connection portion 134B among the circuit patterns 120 disposed on the lower surface of the insulating layer 112B.

Referring to FIG. 7, the circuit board includes an insulating layer 112B and a via portion 130B. The via portion 130B is disposed to pass through the insulating layer 112B.

To this end, the via portion 130B includes a first pad 131B disposed on one surface of the insulating layer 112B and a second pad 132B disposed on the other surface of the insulating layer 112B. In this case, although the drawing shows that the first pad 131B is buried in the lower region of the insulating layer 112B, the embodiment is not limited thereto. For example, the first pad 131B may be disposed under the lower surface of the insulating layer 112B depending on the position of the insulating layer 112B.

The second pad 132B may be disposed on the upper surface of the insulating layer 112B. In addition, the connection portion 134B may be disposed in the insulating layer 112B. At this time, the thickness of the insulating layer 112B in the embodiment may be greater than 40 µm. Accordingly, the via portion 130B may include a third pad 133-3 additionally disposed between the connection portion 134B and the first pad 131.

In other words, the thickness of the connection portion 134B is smaller than the thickness of the insulating layer 112B.

Here, the thickness of the insulating layer 112B may mean a distance from the upper surface of the first pad 131B to the lower surface of the second pad 132B.

That is, in the comparative example, the connection portion was disposed between the first pad and the second pad regardless of the thickness of the insulating layer. In other words, in the comparative example, the connection portion was formed to have the same thickness as the thickness of the insulating layer corresponding to the distance between the first pad and the second pad. And, in this case, a plating defect such as a void region occurs in the connection portion.

Accordingly, in the embodiment, the third pad 133-3 is additionally disposed between the first pad 131B and the connection portion 134B to reduce the thickness of the connection portion 134B by the thickness of the third pad 133-3. For example, even if the thickness of the insulating layer 112B is greater than 40 µm, the thickness of the connection portion 134B may be less than 20 µm. In other words, the thickness of the connection portion 134B may correspond to the thickness of the insulating layer 112B minus the thickness of the third pad 133-3.

Here, the third pad 133-3 may have a thickness greater than 20 µm according to manufacturing process capability. Accordingly, the third pad 133-3 may have a single-layer structure different from the third pads 133-1 and 133-2 of FIG. 6. That is, the thickness of the third pad 133-3 may correspond to the sum of the thicknesses of the third pads 133-1 and 133-2 having the two-layer structure in FIG. 6.

The first pad 131B may be disposed on one surface of the insulating layer to have a first thickness T1. In addition, the third pad 133B may be disposed on the first pad 131B to have a second-third thickness T2-3 greater than the first thickness T1. In addition, the connection portion 134B may be disposed on the third pad 133 to have a fourth thickness T4.

In this case, the insulating layer 112B may have a third-second thickness T3-2 greater than 40 µm. Preferably, the thickness of the insulating layer 112B may correspond to a distance from the upper surface of the first pad 131B to the lower surface of the second pad 132B.

Meanwhile, the third-third pad 133-3 may have a third-first width W3-1 smaller than the first width W1 of the first pad 131B and may be disposed on the first pad 131. In this case, the third-first width W3-1 of the third-third pad 133-3 may be the same as the first width W1. However, as the width of the third-third pad 133-3 increases, signal loss in the circuit pattern may occur. Accordingly, the width of the third-third pad 133-3 is made smaller than the width of the first pad 131B.

In addition, the connection portion 134B may have different widths on the upper surface and the lower surface. For example, the width of the connection portion 134B may gradually decrease from the upper surface to the lower surface.

The width of the lower surface of the connection portion 134B may be formed to have a fourth width W4 that is smaller than the third-third width W3-3 of the third-third pad 133-3. That is, the third-third pad 133-3 may function as a stopper in the process of forming the via hole constituting the connection portion 134B, and accordingly, the third-third pad 133-3 may be formed to have the third-third width W3-3 greater than a fourth width W4 of the lower surface of the connection portion 134B.

In addition, the upper surface of the connection portion 134B may have a fifth width W5 greater than the fourth width W4 of the lower surface of the connection portion 134B.

In this case, the circuit pattern 120 may be disposed on the lower surface of the insulating layer 112B to correspond to the first pad 131. Preferably, the first pad 131B may be one of a plurality of circuit patterns 120 disposed on the lower surface of the insulating layer 112B.

Accordingly, a plurality of circuit patterns are disposed on the lower surface of the insulating layer 112B. In this case, the circuit pattern constituting the via portion 130B may have a two-layer structure including the third pad 133-3, and the remaining circuit patterns except for may have a one-layer structure. In other words, the first pad 131B may be a circuit pattern disposed in a region vertically overlapping with the connection portion 134B among the circuit patterns 120 disposed on the lower surface of the insulating layer 112B.

Hereinafter, a method of manufacturing a circuit board according to an embodiment will be described.

FIGS. 8 to 14 are views showing a manufacturing method of the circuit board shown in FIG. 3 in order of process.

First, referring to FIG. 8, a first insulating layer 111, which is a basic member in manufacturing a circuit board, is prepared. For example, the first insulating layer 111 may be a core insulating layer, but is not limited thereto.

The first insulating layer 111 is a substrate on which an electric circuit capable of changing wiring is formed, and may include all of a printed circuit board, a wiring board, and an insulating substrate made of an insulating material capable of forming circuit patterns on the surface.

In this case, a metal layer (not shown) may be disposed on at least one surface of the first insulating layer 111. The metal layer may be a seed layer for forming a circuit pattern to be disposed on the surface of the first insulating layer 111.

The metal layer may be formed by electroless plating. Alternatively, copper clad laminate (CCL) may be used.

When the metal layer is formed by electroless plating, roughness may be provided to the surface of the first insulating layer 111 so that plating proceeds smoothly.

Next, a circuit pattern 120 is formed on the surface of the first insulating layer 111.

In this case, the circuit pattern 120 is disposed on the surface of the first insulating layer 111 and may include a trace serving as a signal transmission wiring line and a first pad 131 directly connected to the via portion.

Next, as shown in FIG. 10, a third pad 133 is formed on the first pad 131 of the circuit patterns 120 disposed on the surface of the first insulating layer 111.

At this time, before forming the third pad 133, the thickness of the second insulating layer 112 or the fourth insulating layer 114 to be disposed on or under the first insulating layer 111 is determined, and the third pad 133 may be selectively formed based on the determined thickness of the second insulating layer 112 or the fourth insulating layer 114.

That is, whether the third pad 133 is formed is determined according to the thickness of the second insulating layer 112 or the fourth insulating layer 114, and when it is determined that the third pad 133 is formed, the number of layers or thickness thereof can be determined.

Next, as shown in FIG. 11, a second insulating layer 112 and a fourth insulating layer 114 are laminated on the upper and lower portions of the first insulating layer 111, respectively.

Thereafter, as shown in FIG. 12, a through hole (VH, or via hole) is formed in the first insulating layer 111 and the fourth insulating layer 114 to expose the third pad 133, respectively.

Next, as shown in FIG. 13, a metal material is filled in the through hole to form a via portion connection portion 134 directly connected to the third pad 133.

The metal material forming the connection portion 134 may be any one material selected from copper (Cu), silver (Ag), tin (Sn), gold (Au), nickel (Ni), and palladium (Pd), and the conductive material may be filled using any one or a combination of electroless plating, electrolytic plating, screen printing, sputtering, evaporation, inkjetting and dispensing.

In addition, a second pad 132 directly connected to the connection portion 134 is formed on the surfaces of the second insulating layer 112 and the fourth insulating layer 114.

In this case, the process of forming the third pad 133 may be performed according to the thickness of the insulating layer as follows. For example, depending on the thickness of the insulating layer, the third pad may have the structure of the first-first embodiment shown in FIG. 4 or the structure of the first-second embodiment shown in FIG. 5, or the structure of the first-third embodiment shown in FIG. 6, or the structure of the first-fourth embodiment shown in FIG. 7. Since this has been described in detail above, a description thereof will be omitted.

Hereinafter, the circuit board of a second embodiment will be described.

FIG. 15 is a view showing a circuit board according to a second embodiment.

Referring to FIG. 15, the circuit board includes an insulating layer 1110, a circuit pattern 1120, and a via portion 1130. Since the insulating layer 1110 and the circuit pattern 1120 have already been described in detail in the first embodiment, a detailed description thereof will be omitted.

The via portion 1130 may include a first pad 1131, a second pad 1132, a resin layer 1133, and a connection portion 1134.

Hereinafter, for convenience of description, a via portion disposed in the second insulating layer 1112 among the plurality of insulating layers will be described.

In this case, in the embodiment, the resin layer 1133 may be disposed between the connection portion 1134 and the second insulating layer 1112 according to a surface roughness of the inner wall of the via hole.

That is, a surface roughness of the outer surface of the connection portion 1134 may correspond to a surface roughness of the configuration in contact with the connection portion 1134.

In this case, when the connection portion 1134 is formed directly in the via hole, the surface roughness of the connection portion 1134 may have a value corresponding to the surface roughness of the inner wall of the via hole.

Here, the via hole may be formed in the second insulating layer 1112. In this case, a glass fiber 1112a may be included in the second insulating layer 1112 to secure the strength of the second insulating layer 1112.

Also, when a via hole is formed in the second insulating layer 1112, a portion of the glass fiber 1112a may be exposed through the via hole. That is, the surface roughness of the inner wall of the via hole is affected by the glass fiber 1112a exposed through the via hole, and thus has a value greater than zero. For example, the inner wall of the via hole may have a surface roughness greater than a reference value.

Accordingly, when the connection portion 1134 constituting the via portion 1130 is directly formed in the via hole, the surface roughness of the connection portion 1134 has a value corresponding to the surface roughness of the inner wall of the via hole, and accordingly, it may have a value greater than the reference value.

Accordingly, in the embodiment, a resin layer 1133 is additionally disposed between the connection portion 1134 and the inner wall of the via hole in order to maintain the surface roughness of the inner wall of the via hole at a value substantially corresponding to zero. And, the surface roughness of the inner wall of the via hole is made to have a value close to zero by the resin layer 1133.

That is, the surface roughness of the connection portion constituting the via portion in the comparative example had a value corresponding to the surface roughness of the inner wall of the via hole. The surface roughness of the connection portion in the comparative example was affected by the glass fiber exposed through the via hole, and accordingly, as the surface roughness was larger than the reference value, signal transmission loss occurred.

In contrast, the surface roughness of the connection portion 1134 constituting the via portion 1130 in the embodiment may have a value corresponding to the surface roughness of the resin layer 1133 coated on the inner wall of the via hole, not the surface roughness of the inner wall of the via hole. Accordingly, the surface roughness of the connection portion 1134 in the embodiment is not affected by the glass fiber 1112a, and thus has a surface roughness value close to zero to minimize signal transmission loss.

FIG. 16 is a view showing the structure of a via portion according to a second-first embodiment, and FIG. 17 is a view showing the structure of a via portion according to a second-second embodiment.

In this case, the embodiment of the structure of the via portion 1130 in FIGS. 16 to 17 may be divided by the structure of the resin layer 1133 disposed in the via portion 1130.

The via portion 1130 in the embodiment will be described in detail with reference to FIGS. 16 to 17.

Referring to FIG. 16, the circuit board includes insulating layers 1111 and 1112.

In addition, the via portion 1130 may be disposed on any one of the insulating layers 1111 and 1112. Hereinafter, the second insulating layer 1112 on which the via portion 1130 is disposed will be referred to as an insulating layer.

The via portion 1130 is disposed to pass through the insulating layer 1112.

To this end, the via portion 1130 includes a first pad 1131 disposed on one surface of the insulating layer 1112 and a second pad 1132 disposed on the other surface of the insulating layer 1112.

The second pad 1132 may be disposed on the upper surface of the insulating layer 1112. In addition, the connection portion 1134 may be disposed in the insulating layer 1112.

In this case, the glass fiber 1112a may be included in the insulating layer 1112 in the embodiment.

Accordingly, the resin layer 1133 may be disposed between the inner wall of the via hole formed in the insulating layer 1112 and the connection portion 1134 constituting the via portion 1130. The resin layer 1133 may be formed by filling a portion (1112b) of the glass fiber 1112a exposed through the via hole.

That is, the resin layer 1133 filling a portion (1112b) of the glass fiber 1112a exposed through the via hole in the process of forming the via hole may be included in the embodiment. The resin layer 1133 may include the same insulating material as the insulating layer 1112, but is not limited thereto. However, the resin layer 1133 may be formed of a low-k resin. In addition, the resin layer 1133 may be coated on the inner wall of the via hole by a spray method, but the embodiment is not limited thereto, and the resin layer 1133 may be formed to have a structure in which a portion (1112b) of the glass fiber 1112a exposed through the via hole is buried in various ways.

Accordingly, a portion 1112b of the glass fiber 1112a protruding through the via hole of the insulating layer 1112 may be buried in the resin layer 1133 according to the second-first embodiment In other words, the glass fiber 1112a is included in the insulating layer 1112. In this case, the glass fiber 1112a includes a first portion disposed in the insulating layer 1112 and a second portion 1112b disposed in the resin layer 1133. And, as the connection portion 1134 is disposed on the resin layer 1133, it has a value corresponding to the surface roughness of the outer surface of the resin layer 1133.

Meanwhile, the via portion 1130 may include a metal layer 1135 disposed between the connection portion 1134 and the resin layer 1133.

The metal layer 1135 may be a plating seed layer for forming the connection portion 1134 and the second pad 1132 by an electrolytic plating method.

That is, in the comparative example, when the plating seed layer is included, the plating seed layer is disposed on the inner wall of the via hole of the insulating layer, and has a surface roughness corresponding to the surface roughness of the inner wall of the via hole.

On the contrary, in the embodiment, the resin layer 1133 is formed on the inner wall of the via hole. And as the metal layer 1135 is formed on the formed resin layer 1133, the surface roughness of the metal layer 1135 has a value corresponding to the surface roughness of the resin layer 1133 rather than the inner wall of the via hole.

The metal layer 1135 may be disposed on an inner wall of the via hole and on at least one of upper and lower surfaces of the insulating layer 1112. For example, the metal layer 1135 may be disposed between the upper surface of the insulating layer 1112 and the second pad 1132. In addition, although not shown in the drawings, when the first pad 1131 has a structure protruding under the lower surface of the insulating layer 1112, the metal layer 1135 may also be formed between the lower surface of the insulating layer 1112 and the first pad 1131.

At least a portion of the resin layer 1133 may contact the first pad 1131. For example, the resin layer 1133 may be disposed on the first pad 1131 exposed through the via hole. In this case, the resin layer 1133 is disposed to expose at least a portion of the upper surface of the first pad 1131, and thus the connection portion 1134 and the first pad 1131 can be electrically connected to each other.

Accordingly, the upper surface of the first pad 1131 has a first portion in contact with the insulating layer 1112, a second portion in contact with the resin layer 1133, a third portion in contact with the metal layer 1135, and a fourth portion in contact with the connection portion 1134.

Referring to FIG. 17, the circuit board includes insulating layers 1111 and 1112.

In addition, a via portion 1130*a* may be disposed on any one of the insulating layers 1111 and 1112.

The via portion 1130*a* includes a first pad 1131*a* disposed on one surface of the insulating layer 1112 and a second pad 1132*a* disposed on the other surface of the insulating layer 1112.

The second pad 1132*a* may be disposed on the upper surface of the insulating layer 1112. In addition, the connection portion 1134*a* may be disposed in the insulating layer 1112.

In this case, the glass fiber 1112*a* may be included in the insulating layer 1112 in the embodiment.

Accordingly, the resin layer 1133*a* may be disposed between the inner wall of the via hole formed in the insulating layer 1112 and the connection portion 1134*a* constituting the via portion 1130*a*. The resin layer 1133*a* may be formed by filling the glass fiber 1112*a* exposed through the via hole.

That is, the resin layer 1133*a* filling the glass fiber 1112*a* exposed through the via hole in the process of forming the via hole may be included in the embodiment. The resin layer 1133*a* may include the same insulating material as the insulating layer 1112, but is not limited thereto. However, as the resin layer 1133*a*, a low-k resin may be used. In addition, the resin layer 1133*a* may be coated on the inner wall of the via hole by a spray method, but is not limited thereto, and the resin layer 1133*a* may be formed in various ways.

Meanwhile, unlike the second-first embodiment, the glass fiber 1112*a* may not be disposed in the resin layer 1133*a* according to the second-second embodiment.

That is, in second-second embodiment, a process of removing the glass fiber 1112*a* exposed through the via hole before forming the resin layer 1133*a* may be performed, accordingly, the glass fiber 1112*a* exposed through the via hole may not exist. Accordingly, the glass fiber 1112*a* is not disposed in the resin layer 1133*a* according to the second-second embodiment.

However, in second-second embodiment, in the process of removing the glass fiber 1112*a* exposed through the via hole, the inner wall of the via hole may have a curvature of a predetermined curvature. Accordingly, the side surface 1133*b* of the resin layer 1133*a* in contact with the inner wall of the via hole may be formed as a curved surface having a curvature corresponding to the inner wall of the via hole. However, the other side surface of the resin layer 1133*a* opposite to the side surface 1133*b* may be a flat surface rather than a curved surface. That is, the other side surface of the resin layer 1133*a* may be a plane having a predetermined inclination angle.

In this case, the resin layer in second-first embodiment is disposed to bury the glass fibers 1112*a*, and accordingly, it has to have a width greater than or equal to a certain level according to the degree of exposure of the glass fibers 1112*a*. Here, as the width of the resin layer increases, an area of the connection portion 1134 decreases, which may cause a problem in signal transmission reliability. Therefore, in second-second embodiment, a process of removing the glass fiber 1112*a* exposed through the via hole is performed before forming the resin layer 1133*a*, and accordingly, the resin layer 1133*a* is formed after the glass fiber 1112*a* is removed to minimize the width of the resin layer 1133*a*.

Meanwhile, the via portion 1130*a* may include a metal layer 1135*a* disposed between the connection portion 1134*a* and the resin layer 1133*a*.

The metal layer 1135*a* may be a plating seed layer for forming the connection portion 1134*a* and the second pad 1132*a* using an electrolytic plating method.

The metal layer 1135*a* may be disposed on an inner wall of the via hole and on at least one of upper and lower surfaces of the insulating layer 1112. For example, the metal layer 1135*a* may be disposed between the upper surface of the insulating layer 1112 and the second pad 1132*a*. In addition, although not shown in the drawings, when the first pad 1131*a* has a structure protruding under the lower surface of the insulating layer 1112, the metal layer 1135*a* may also be formed between the lower surface of the insulating layer 1112 and the first pad 1131*a*.

FIG. 18 is a view showing a circuit board according to a third embodiment, and FIG. 19 is a view showing a circuit board according to a fourth embodiment.

However, since the circuit board according to the third embodiment substantially illustrated in FIG. 18 has already been described with reference to FIGS. 4 and 16, a detailed description thereof will be omitted. That is, the via portion in FIG. 4 includes only the third pad, and the via portion in FIG. 16 includes only the resin layer. Alternatively, as shown in FIG. 18, the via portion may include both the third pad and the resin layer. In this case, the third pad may have any one of the structures of FIGS. 4 to 7 according to the thickness of the insulating layer.

Specifically, referring to FIG. 18, in the circuit board, a via portion 2130 may be disposed on any one of the insulating layers 2111 and 2112. The via portion 2130 is disposed to pass through the insulating layer 2112.

To this end, the via portion 2130 includes a first pad 2131 disposed on one surface of the insulating layer 2112 and a second pad 2132 disposed on the other surface of the insulating layer 2112.

The second pad 2132 may be disposed on the upper surface of the insulating layer 1112. In addition, the connection portion 2134 may be disposed in the insulating layer 2112.

In this case, the glass fiber 2112*a* may be included in the insulating layer 2112 in the embodiment.

Accordingly, the resin layer 2133 may be disposed between the inner wall of the via hole formed in the insulating layer 2112 and the connection portion 2134 constituting the via portion 2130. The resin layer 2133 may be formed by filling a portion 2112b of the glass fiber 2112a exposed through the via hole.

In addition, the via portion 2130 may include a metal layer 2135 disposed between the connection portion 2134 and the resin layer 2133.

Also, the via portion 2130 may include a third pad 2136 disposed between the first pad 1131 and the connection portion 2134. The upper surface of the third pad 2136 may be divided into a portion in contact with the connection portion 2134, a portion in contact with the metal layer 2135, and a portion in contact with the resin layer 2133.

Likewise, since the circuit board according to the fourth embodiment shown in FIG. 19 has already been described with reference to FIGS. 4 and 17, a detailed description thereof will be omitted. That is, the via portion in FIG. 4 includes only the third pad, and the via portion in FIG. 17 includes only the resin layer. Alternatively, as shown in FIG. 1+, the via portion may include both the third pad and the resin layer. In this case, the third pad may have any one of the structures of FIGS. 4 to 7 according to the thickness of the insulating layer.

Referring to FIG. 19, a via portion 2130a may be disposed on any one of the insulating layers 2111 and 2112.

The via portion 2130a includes a first pad 2131a disposed on one surface of the insulating layer 2112 and a second pad 2132a disposed on the other surface of the insulating layer 2112.

The second pad 2132a may be disposed on the upper surface of the insulating layer 2112. In addition, the connection portion 2134a may be disposed in the insulating layer 2112.

And, in the embodiment, a process of removing the glass fiber 2112a exposed through the via hole may be performed before forming the resin layer 2133a, and accordingly, the glass fiber 2112a exposed through the via hole may not exist. Accordingly, the glass fiber 2112a is not disposed in the resin layer 2133a.

However, the inner wall of the via hole may have a curvature of a predetermined curvature by the process of removing the glass fiber 2112a exposed through the via hole. Accordingly, the side surface 2133b of the resin layer 2133a in contact with the inner wall of the via hole may be formed as a curved surface having a curvature corresponding to the inner wall of the via hole.

Also, the via portion 2130a may include a third pad 1136a and a metal layer 1135a.

The circuit board of the embodiment includes a via portion disposed in the insulating layer. In this case, the via portion is a first pad disposed on one surface of the insulating layer, a second pad disposed on the other surface of the insulating layer, and a connection portion disposed in the insulating layer and connecting the first pad and the second pad. In this case, in the embodiment, an additional third pad is disposed between the connection portion and the first pad in order to solve a plating defect problem occurring in the connection portion depending on the thickness of the insulating layer. In this case, the thickness of the third pad may be determined by the thickness of the insulating layer. In addition, the third pad may have the same thickness as the first pad and may have a plurality of layers according to the thickness of the insulating layer. Accordingly, the embodiment can solve plating defects such as voids occurring in the plating process of the via hole formed in the insulating layer, and accordingly, the reliability of the circuit board can be improved. In addition, the embodiment may secure the design freedom of the circuit board according to the design change of the via portion.

In addition, in the circuit board of the embodiment, a surface roughness value of the via portion may have a value substantially close to zero. Specifically, the insulating layer of the circuit board contains glass fibers, and accordingly, the glass fiber may be exposed through the via hole in the process of forming the via hole. And, when the connection portion of the via portion is formed in a state in which the glass fiber is exposed, the surface roughness of the connection portion is increased by the glass fiber, and thus a signal loss occurs. Accordingly, in the embodiment, a resin layer is formed on the inner wall of the via hole after the via hole is formed. In this case, the resin layer may cover the glass fiber exposed through the via hole. In addition, the connection portion of the via portion is formed on the resin layer formed on the inner wall of the via hole. Accordingly, an outer surface of the connection portion of the via portion of the embodiment has a value corresponding to the surface roughness of the resin layer, and this may be a value substantially close to zero. Accordingly, in the embodiment, the surface roughness of the connection portion can be maintained at a value close to zero by removing the exposure of the glass fiber through the inner wall of the via hole of the insulating layer, and accordingly, it is possible to minimize the signal loss generated through the connection portion.

In addition, the embodiment can minimize the surface roughness of the via portion to minimize the transmission loss in the high-frequency region, and accordingly, it is possible to provide a circuit board applicable to an application product using a high frequency band.

The characteristics, structures and effects described in the embodiments above are included in at least one embodiment but are not limited to one embodiment. Furthermore, the characteristics, structures, effects, and the like illustrated in each of the embodiments may be combined or modified even with respect to other embodiments by those of ordinary skill in the art to which the embodiments pertain. Thus, it would be construed that contents related to such a combination and such a modification are included in the scope of the embodiments.

The above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are included in the scope of the present invention defined in the appended claims.

What is claimed is:

1. A circuit board comprising:
an insulating layer;
a circuit layer disposed at a lower surface of the insulating layer;
a through via disposed in a through hole passing through at least a portion of the insulating layer along a vertical direction; and
an additional pad disposed between the circuit layer and the through via,
wherein the additional pad does not overlap the through hole along a horizontal direction, wherein the circuit layer includes:
  a pad portion provided in an overlapping region overlapping the through via along the vertical direction, and
  a circuit part provided in a non-overlapping region that does not overlap the through via along the vertical direction,
wherein the additional pad is disposed between the pad portion and the through via,
wherein an upper surface of the circuit part is covered with the insulating layer, and
wherein a thickness in the vertical direction of the pad portion is different from a thickness in the vertical direction of the additional pad.

2. The circuit board of claim 1,
wherein a thickness of the additional pad has a level of 50% to 80% of a thickness of the insulating layer in a region the area overlapping the pad portion along the vertical direction.

3. The circuit board of claim 1,
wherein the thickness of the insulating layer exceeds 20 μm.

4. The circuit board of claim 1,
wherein the thickness in the vertical direction of the pad portion is smaller than the thickness in the vertical direction of the additional pad.

5. The circuit board of claim 4,
wherein a width in the horizontal direction of the pad portion is different from a width in the horizontal direction of the additional pad.

6. The circuit board of claim 5,
wherein the width in the horizontal direction of the pad portion is greater than the width in the horizontal direction of the additional pad.

7. The circuit board of claim 6,
wherein the pad portion includes:
  a first portion overlapping the additional pad along the vertical direction, and
  a second portion that does not overlap the additional pad along the vertical direction, and
wherein the thickness in the vertical direction of the additional pad is different from a thickness the vertical direction of the second portion of the pad portion.

8. The circuit board of claim 1, further comprising:
a resin layer disposed in the through hole and disposed between an inner wall of the through hole and the through via, and
wherein a side surface of the through via is in direct contact with the resin layer.

9. The circuit board of claim 8,
wherein the insulating layer includes glass fibers therein, and
wherein at least a portion of the glass fiber exposed through the through hole is disposed in the resin layer.

10. The circuit board of claim 8,
wherein the inner wall of the through hole includes a curved surface, and
wherein a side surface of the resin layer in contact with the inner wall of the through hole includes a curved surface corresponding to the inner wall of the through hole.

11. The circuit board of claim 7,
wherein the thickness in the vertical direction of the additional pad is greater than the thickness in the vertical direction of the first portion of the pad portion.

12. The circuit board of claim 11,
wherein each of thicknesses in the vertical direction of the first portion and the second portion of the pad portion is the same as a thickness in the vertical direction of the circuit part.

13. The circuit board of claim 8, further comprising:
a metal layer disposed in the through hole and disposed between the resin layer and the through via.

14. The circuit board of claim 13,
wherein an upper surface of the additional pad includes:
  a first portion in contact with the insulating layer;
  a second portion in contact with the resin layer;
  a third portion in contact with the metal layer; and
  a fourth portion in contact with the through via.

15. The circuit board of claim 6,
wherein the through via has a slope whose width gradually decreases from an upper surface of the through via toward a lower surface of the through via, and
wherein a width in the horizontal direction of the additional pad is greater than a width in the horizontal direction of the lower surface of the through via.

16. The circuit board of claim 15,
wherein the lower surface of the through via is positioned higher than an upper surface of circuit part.

17. The circuit board of claim 7, wherein the thickness in the vertical direction of the additional pad is greater than a thickness in the vertical direction of the circuit part.

18. The circuit board of claim 7, wherein each thickness of the first portion and the second portion of the pad portion is same as a thickness of the circuit part.

* * * * *